US005756385A

United States Patent [19]
Yuan et al.

[11] Patent Number: 5,756,385
[45] Date of Patent: May 26, 1998

[54] DENSE FLASH EEPROM CELL ARRAY AND PERIPHERAL SUPPORTING CIRCUITS FORMED IN DEPOSITED FIELD OXIDE WITH THE USE OF SPACERS

[75] Inventors: Jack H. Yuan. Cupertino; Eliyahou Harari. Los Gatos; Henry Chien; Gheorghe Samachisa. both of San Jose, all of Calif.

[73] Assignee: SanDisk Corporation. Sunnyvale, Calif.

[21] Appl. No.: 562,198

[22] Filed: Nov. 22, 1995

Related U.S. Application Data

[62] Division of Ser. No. 414,333, Mar. 30, 1994, Pat. No. 5,534,456, which is a division of Ser. No. 248,735, May 25, 1994, Pat. No. 5,661,053.

[51] Int. Cl.[6] .............................................. H01L 21/8247
[52] U.S. Cl. .............................................. 438/258; 438/981
[58] Field of Search .................................. 437/43, 52, 48, 437/69, 979, 41, 44; 438/258, 981

[56] References Cited

U.S. PATENT DOCUMENTS

| 3,970,486 | 7/1976  | Kooi .        |
|-----------|---------|---------------|
| 4,101,344 | 7/1978  | Kooi et al. . |
| 4,267,632 | 5/1981  | Shappir .     |
| 4,352,236 | 10/1982 | McCollum .    |
| 4,385,432 | 5/1983  | Jain et al. . |
| 4,574,465 | 3/1986  | Rao .         |

(List continued on next page.)

FOREIGN PATENT DOCUMENTS

| 594137A  | 1/1984  | Japan . |
|----------|---------|---------|
| 1260841A | 10/1989 | Japan . |
| 3101252A | 4/1991  | Japan . |

OTHER PUBLICATIONS

Wolf et al., "Silicon Processing for the VLSI Era: Volume 1–Process Technology," pp. 177–179 (1986), month unknown.

*Primary Examiner*—John Niebling
*Assistant Examiner*—Richard A. Booth
*Attorney, Agent, or Firm*—Majestic, Parsons, Siebert & Hsue

[57] ABSTRACT

Techniques of forming a flash EEPROM cell array with the size of individual cells being reduced, thereby increasing the number of cells which may be formed on a semiconductor substrate of a given size. Use of dielectric spacers in several steps of the process controls areas being etched or implanted with ions to something smaller than can be obtained by the highest resolution photolithography. Both split-channel and non-split-channel (no select transistor) types of memory cells are included. Example cells employ three polysilicon layers, having separate floating, control and erase gates. A technique of forming the memory cell gates with greater uniformity of conductivity level includes depositing undoped polysilicon and then using ion implantation to introduce the dopant. Field oxide is formed at an early stage in the process by CVD deposition and dry etching. The memory cell array and adjacent peripheral components are formed in a coordinated manner on a single integrated circuit chip.

4 Claims, 15 Drawing Sheets

U.S. PATENT DOCUMENTS

| | | | |
|---|---|---|---|
| 4,721,687 | 1/1988 | Kakumu et al. | 437/69 |
| 4,766,088 | 8/1988 | Kono et al. | 437/52 |
| 4,780,431 | 10/1988 | Maggioni et al. | 437/52 |
| 4,849,369 | 7/1989 | Jeuch et al. . | |
| 4,971,923 | 11/1990 | Nakanishi | 437/52 |
| 5,025,494 | 6/1991 | Gill et al. . | |
| 5,045,489 | 9/1991 | Gill et al. . | |
| 5,061,654 | 10/1991 | Shimizu et al. | 437/70 |
| 5,070,032 | 12/1991 | Yuan et al. . | |
| 5,082,794 | 1/1992 | Pfiester et al. | 437/40 |
| 5,095,344 | 3/1992 | Harari . | |
| 5,196,367 | 3/1993 | Lu et al. . | |
| 5,312,781 | 5/1994 | Gregor et al. . | |
| 5,336,628 | 8/1994 | Hartmann . | |
| 5,343,063 | 8/1994 | Yuan et al. . | |
| 5,350,706 | 9/1994 | McElroy et al. . | |
| 5,362,685 | 11/1994 | Gardner et al. | 437/238 |
| 5,369,052 | 11/1994 | Kenkare et al. | 437/70 |
| 5,372,951 | 12/1994 | Anjum et al. | 437/24 |
| 5,374,575 | 12/1994 | Kim et al. . | |
| 5,385,857 | 1/1995 | Solo de Zaldivar . | |
| 5,397,724 | 3/1995 | Nakajima et al. . | |
| 5,409,854 | 4/1995 | Bergemont . | |
| 5,418,176 | 5/1995 | Yang et al. . | |
| 5,427,963 | 6/1995 | Richart et al. . | |

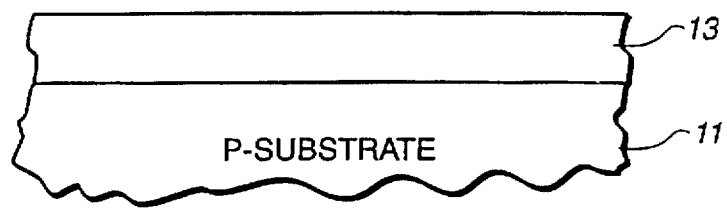
FIG._1
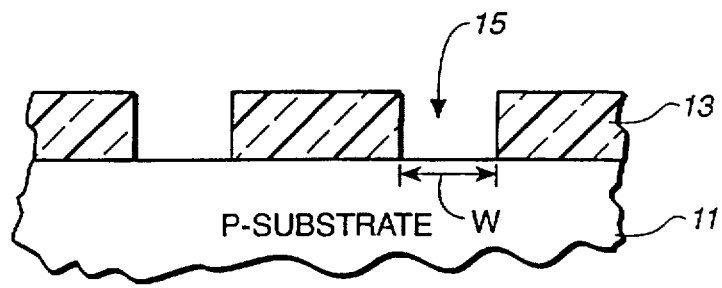
FIG._2
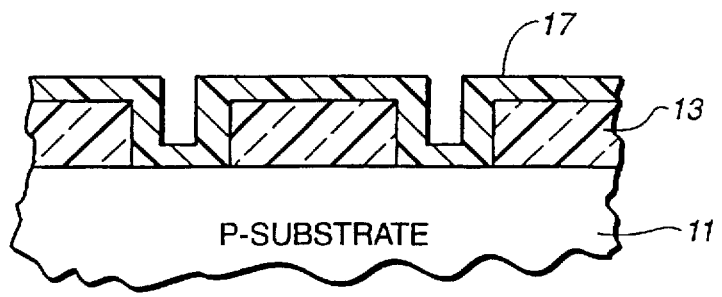
FIG._3
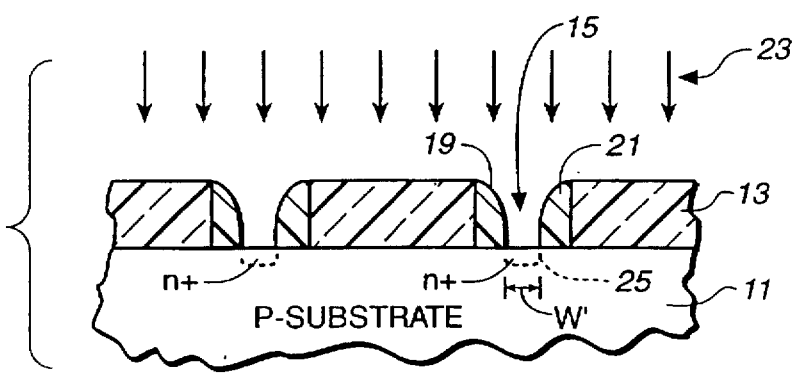
FIG._4
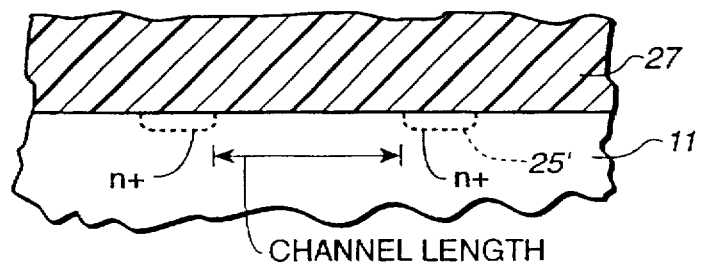
FIG._5

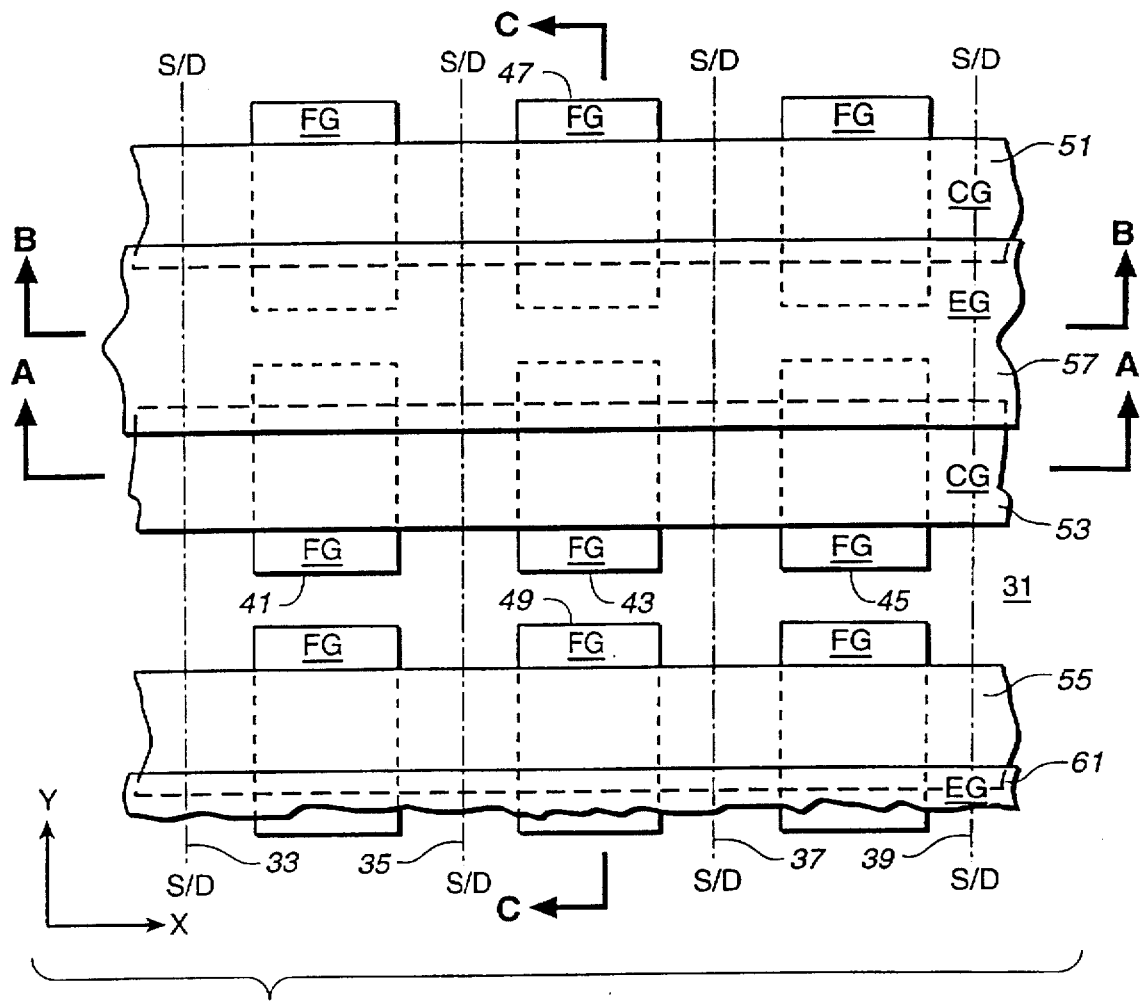
FIG._6
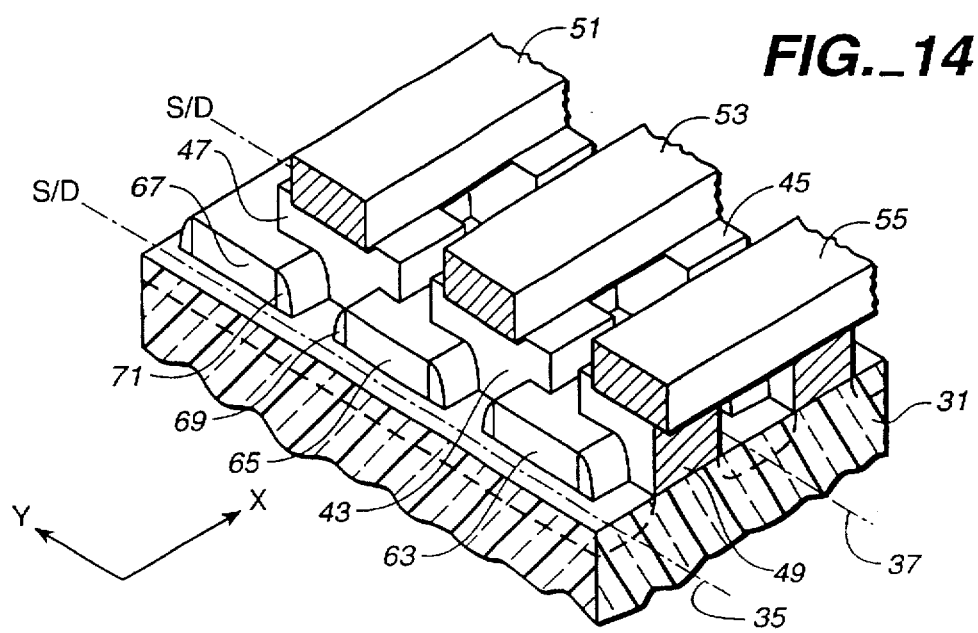
FIG._14

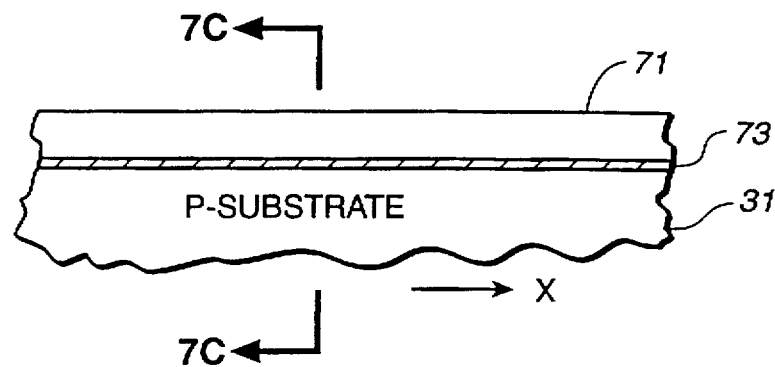
FIG._7A
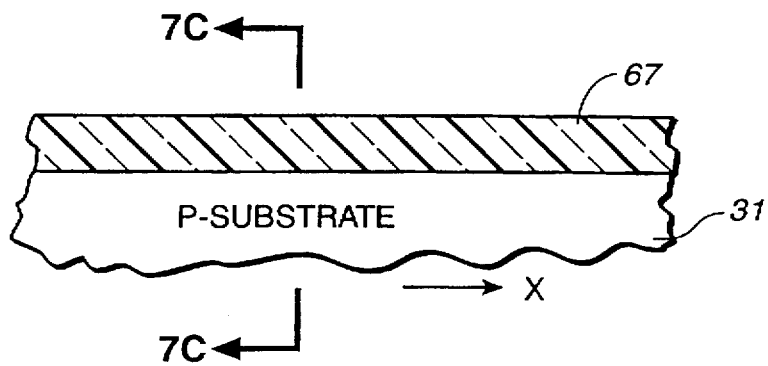
FIG._7B
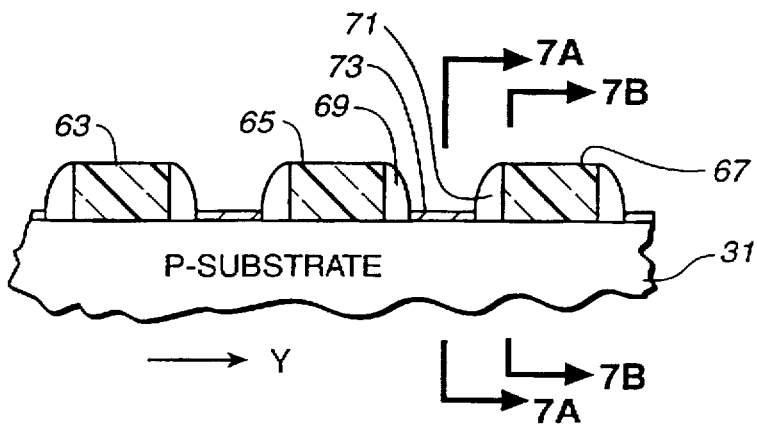
FIG._7C

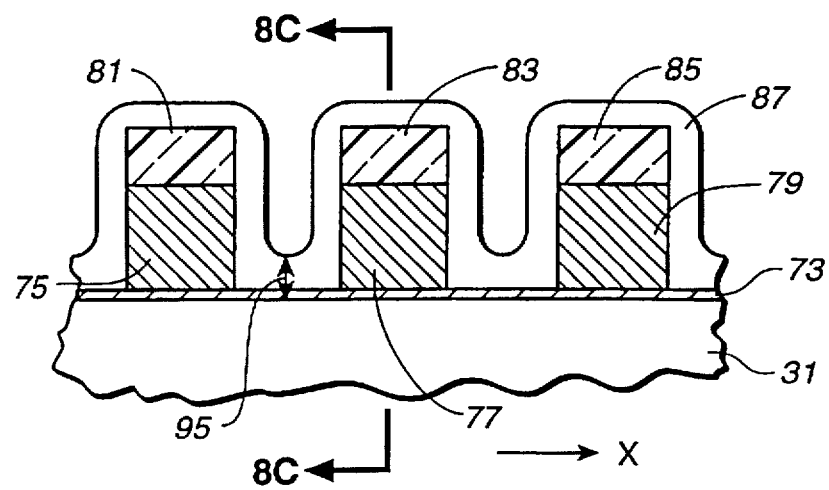
FIG._8A
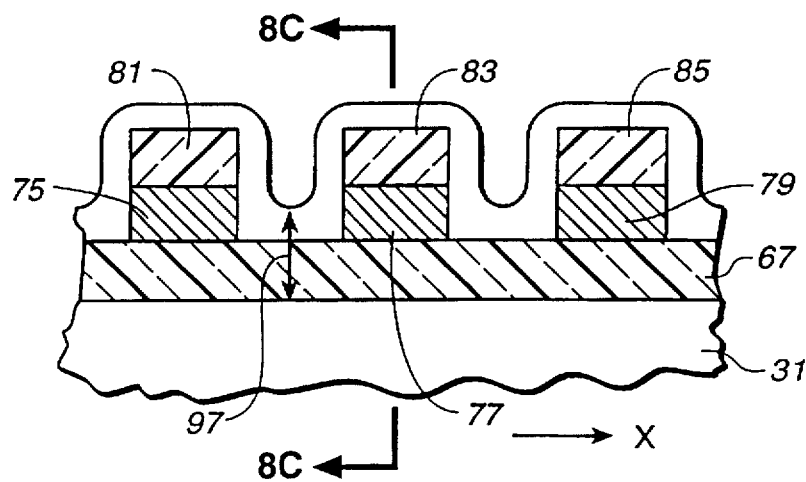
FIG._8B
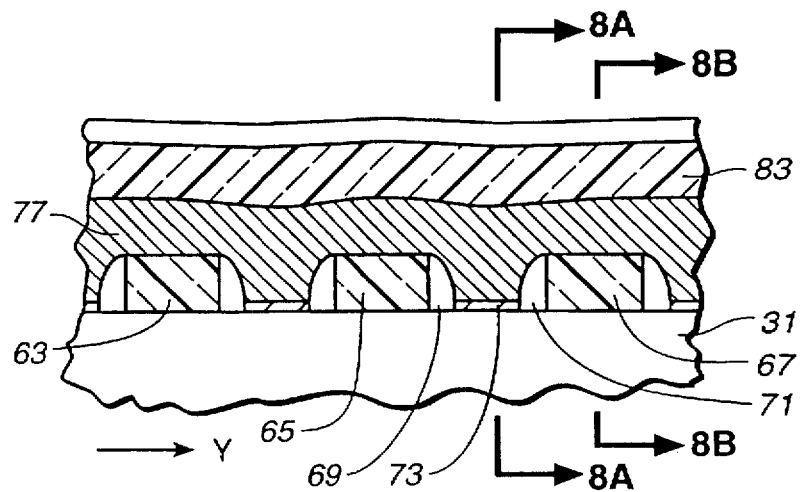
FIG._8C

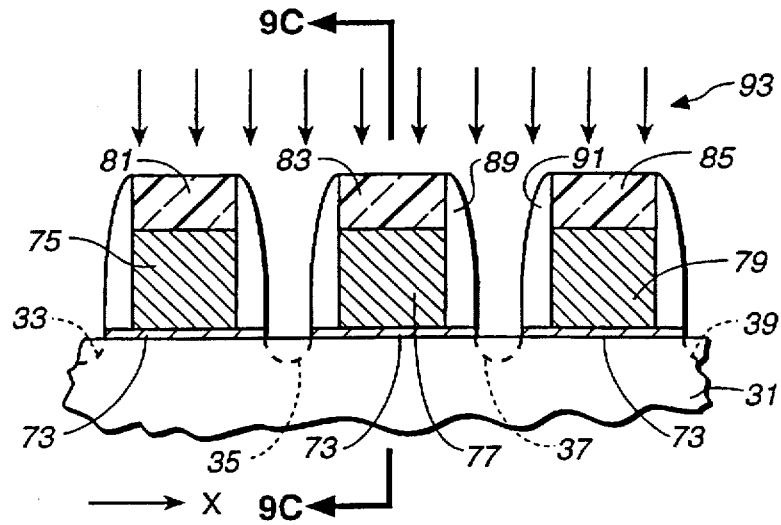
FIG._9A
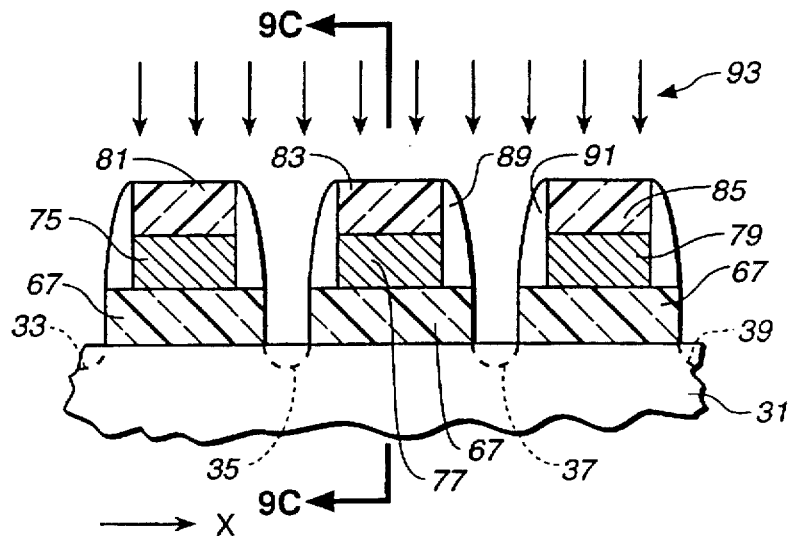
FIG._9B
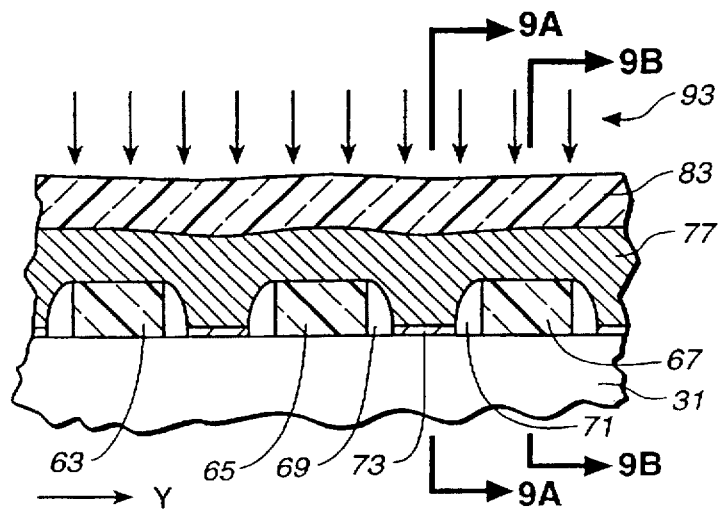
FIG._9C

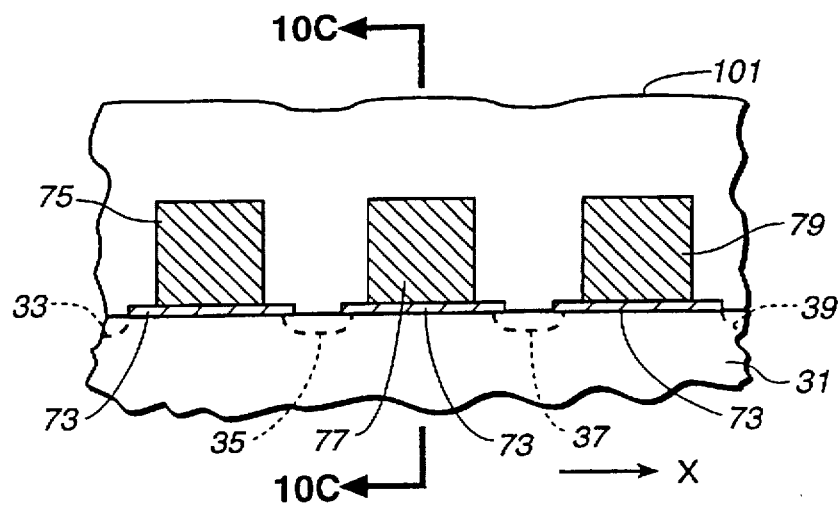
FIG._10A
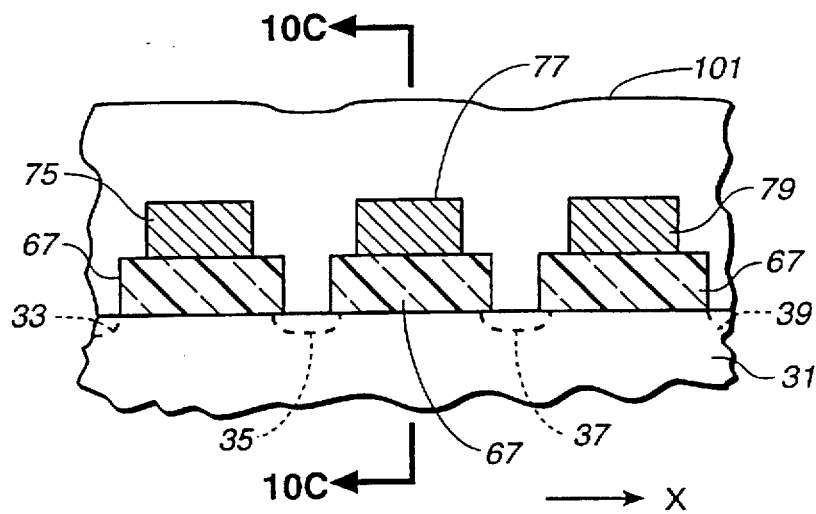
FIG._10B
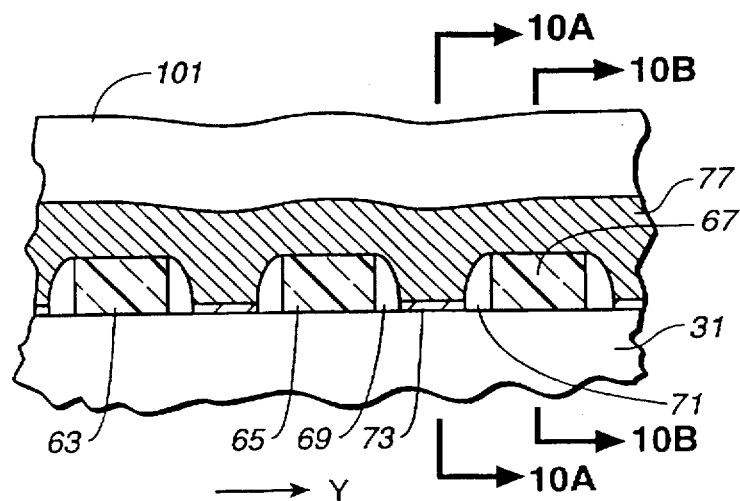
FIG._10C

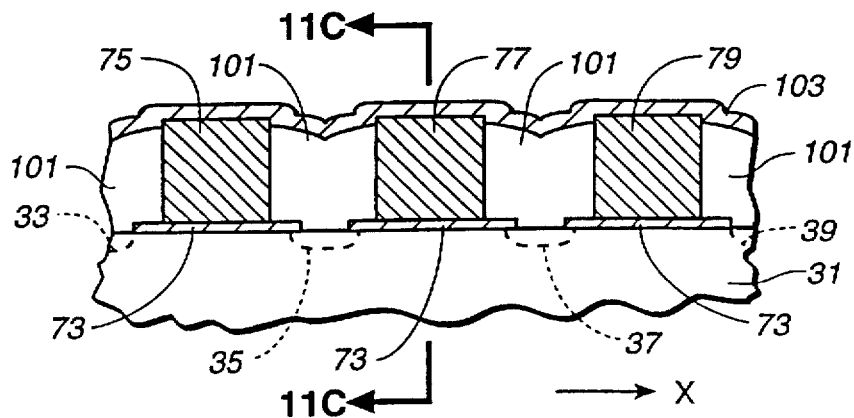
FIG._11A
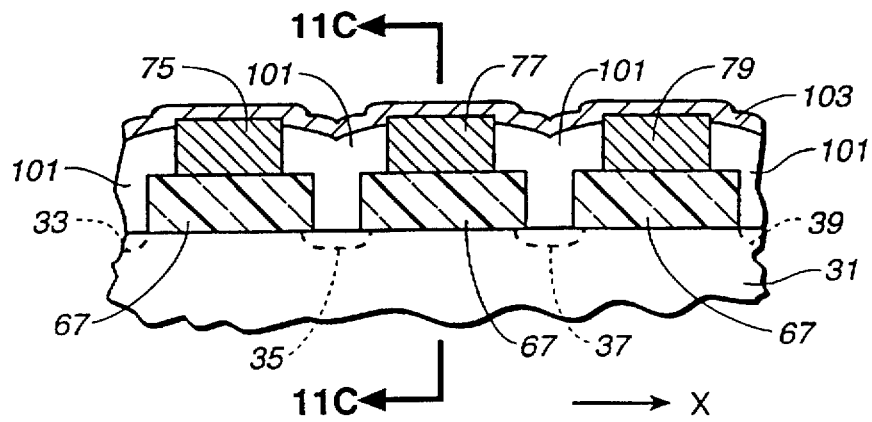
FIG._11B
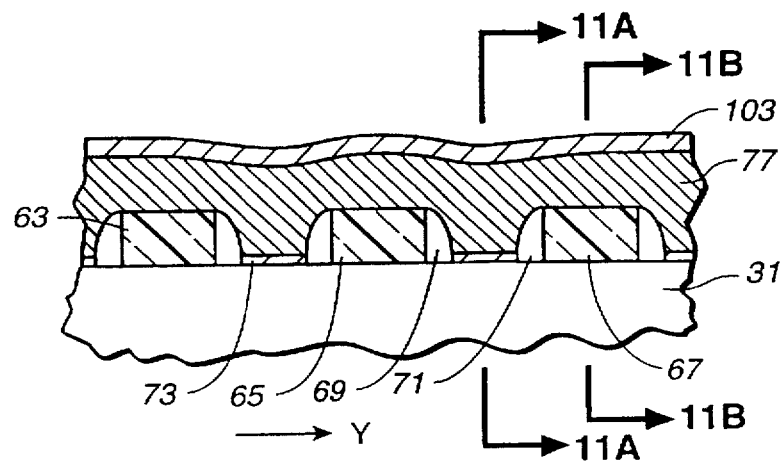
FIG._11C

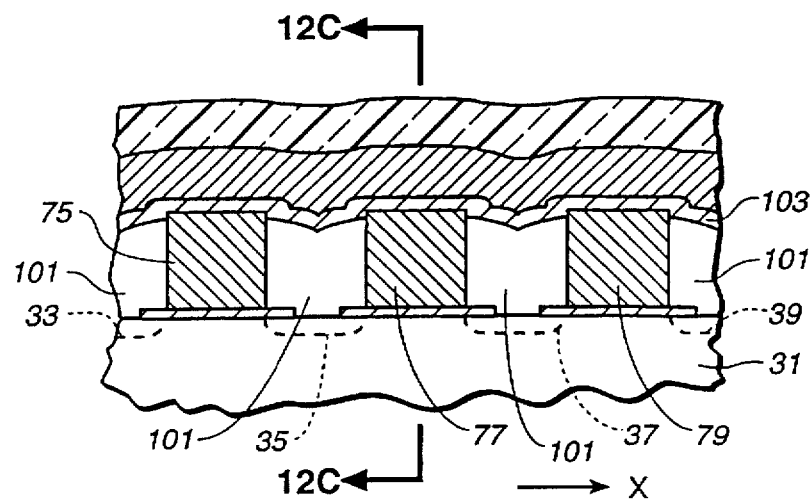
FIG._12A
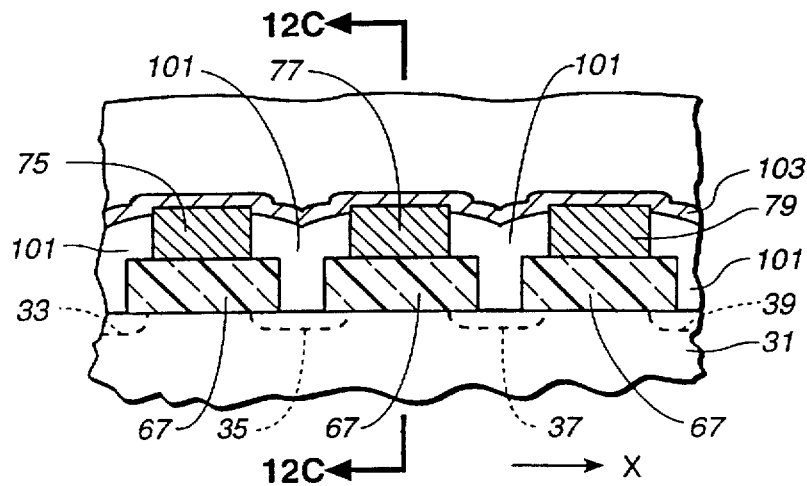
FIG._12B
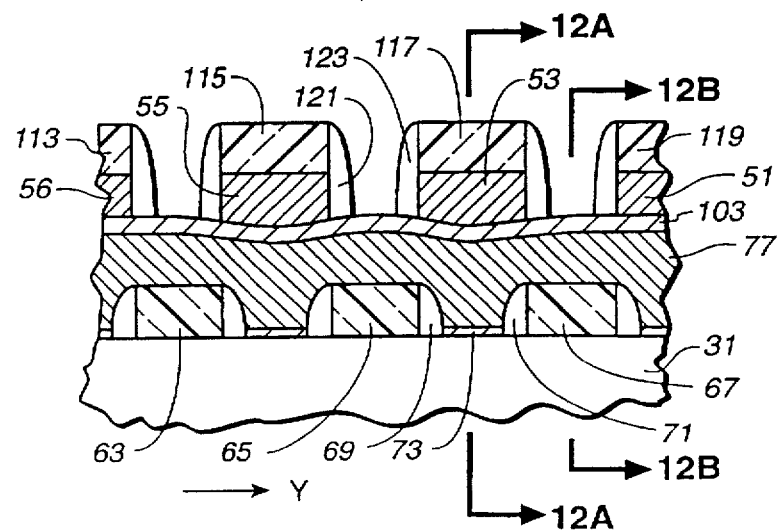
FIG._12C

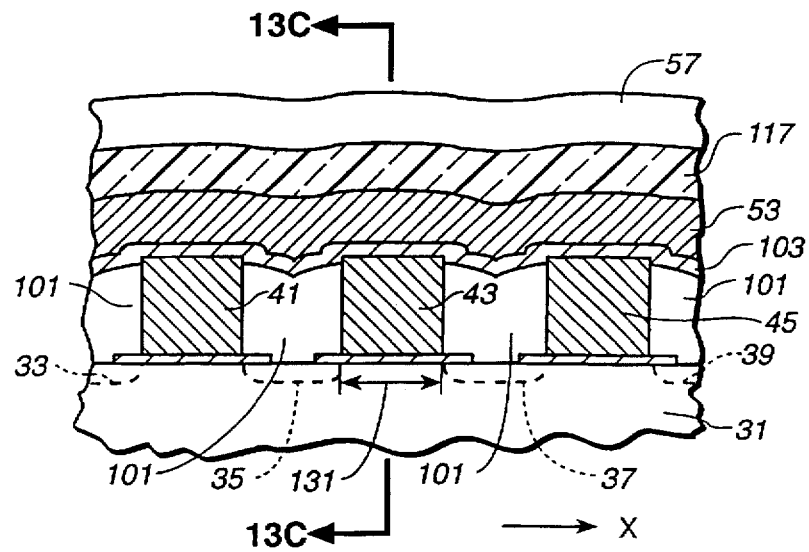
FIG._13A
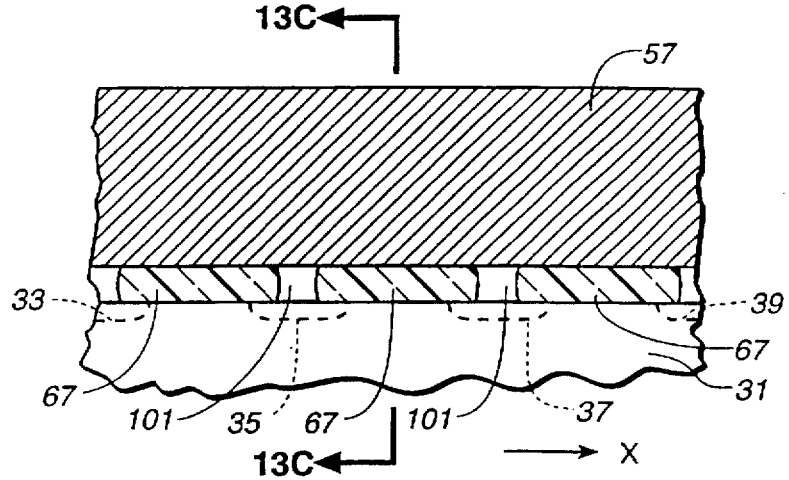
FIG._13B
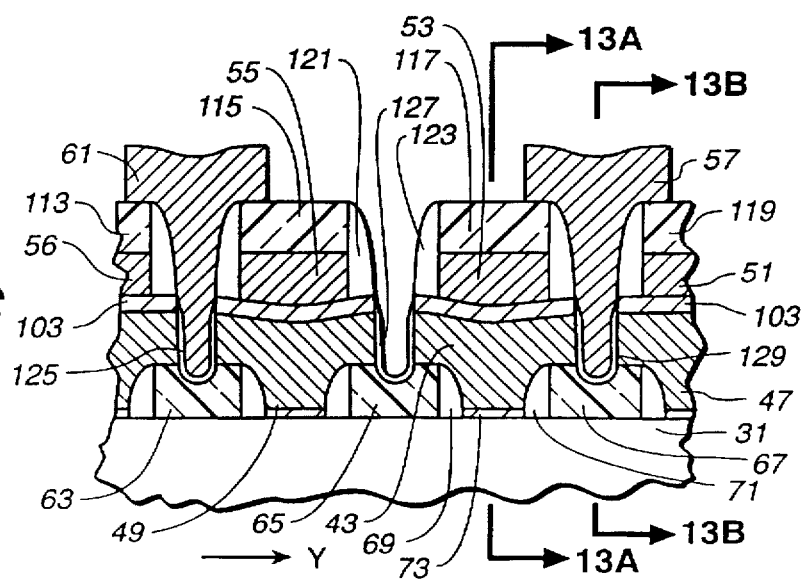
FIG._13C

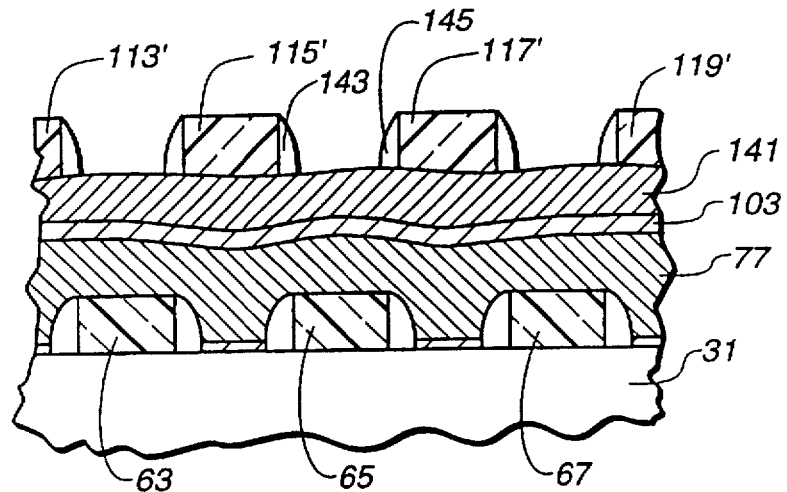
FIG._15
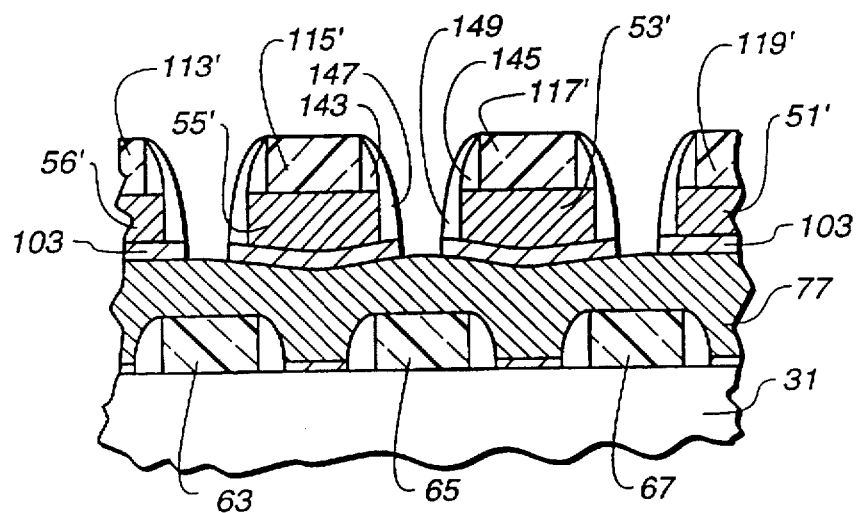
FIG._16
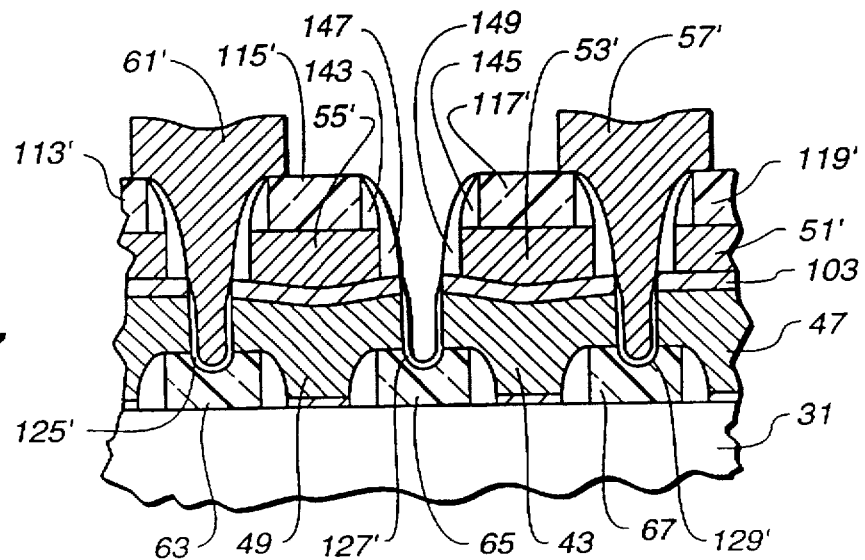
FIG._17

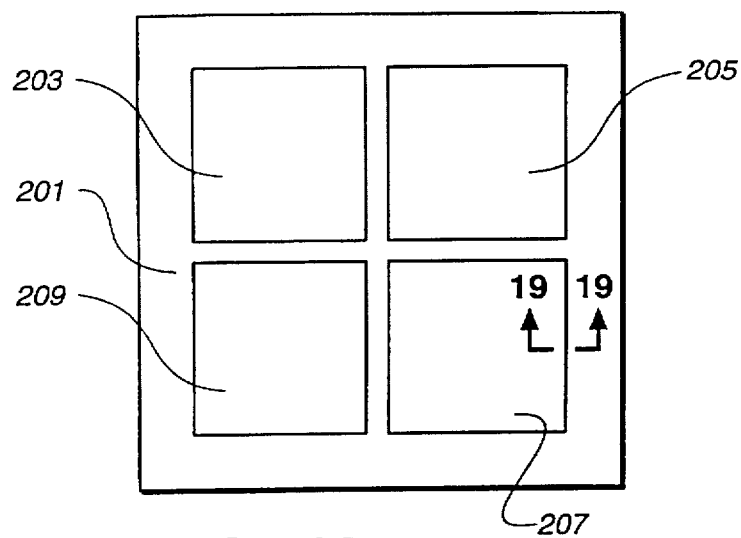
FIG._18
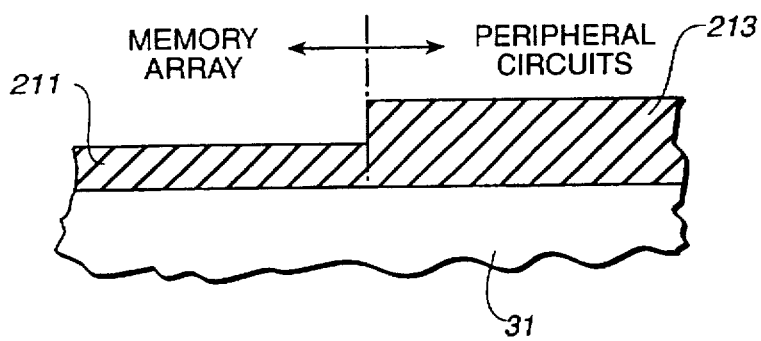
FIG._19
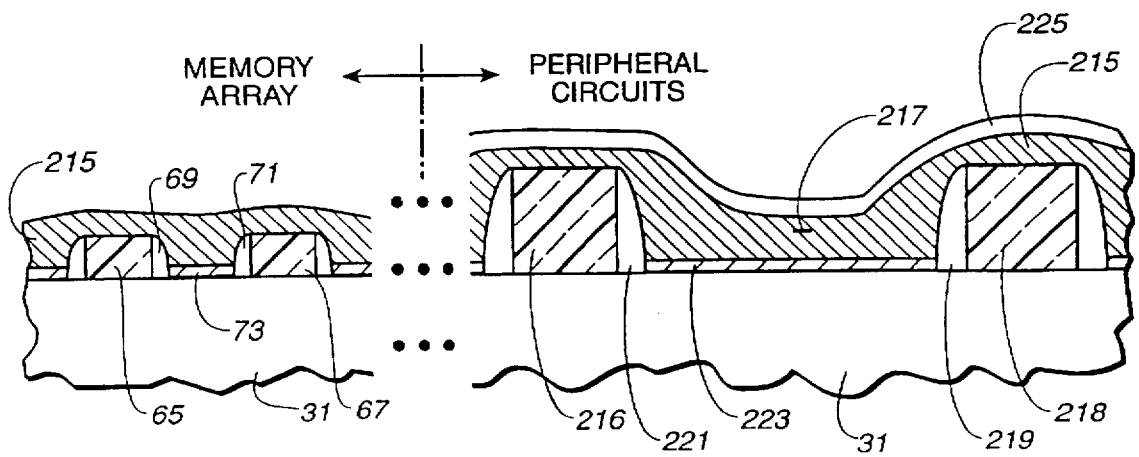
FIG._20

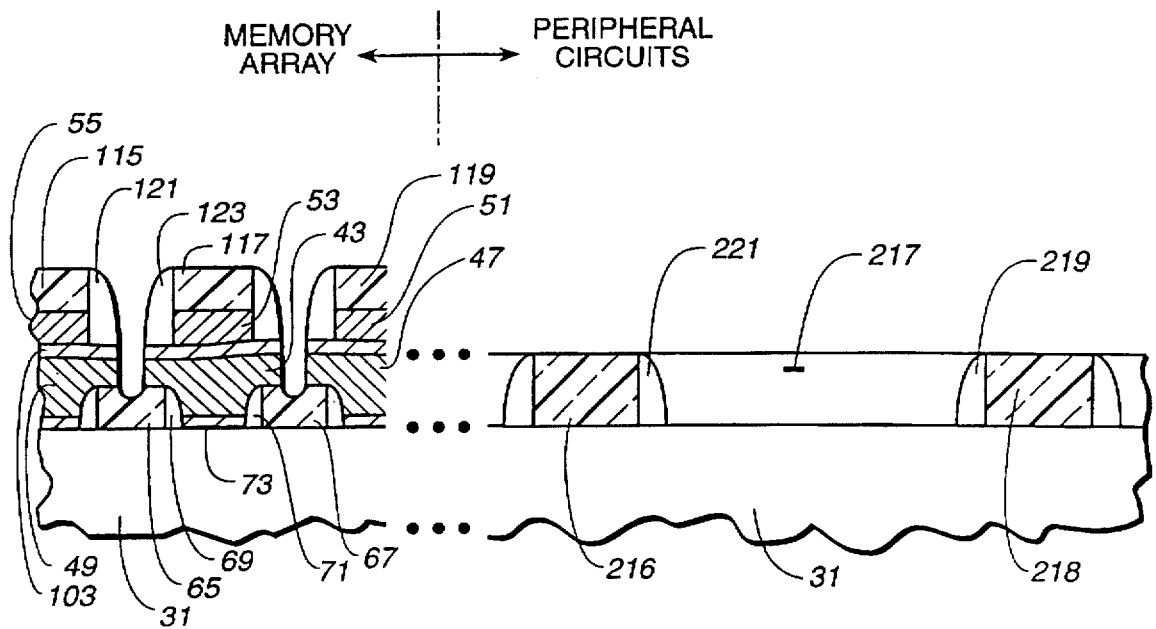
FIG._21
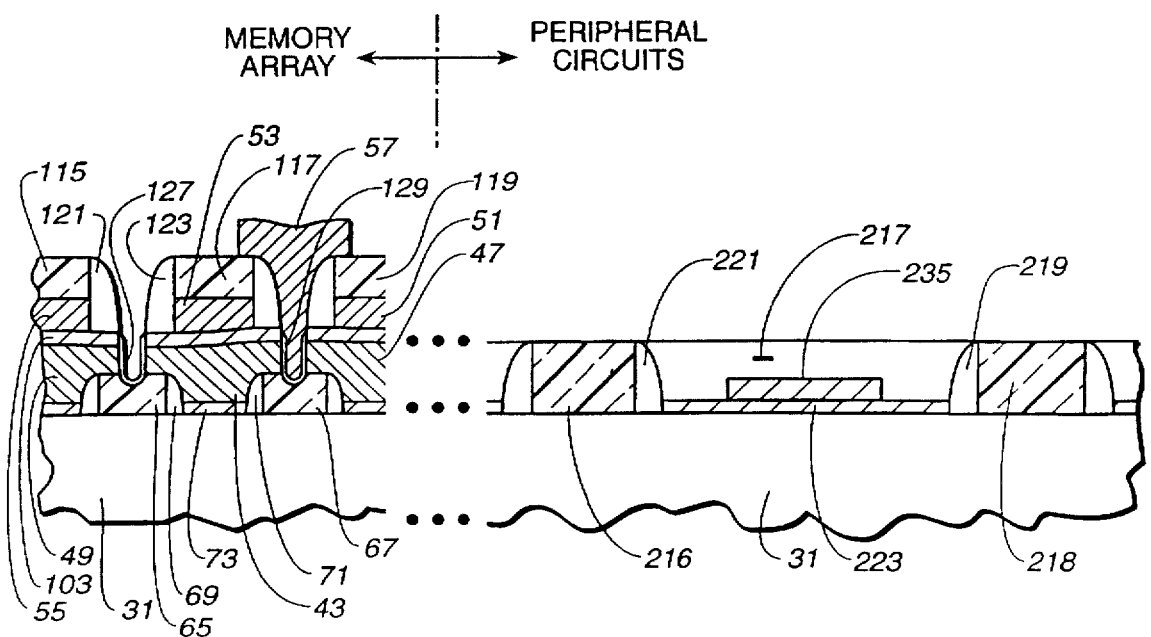
FIG._22

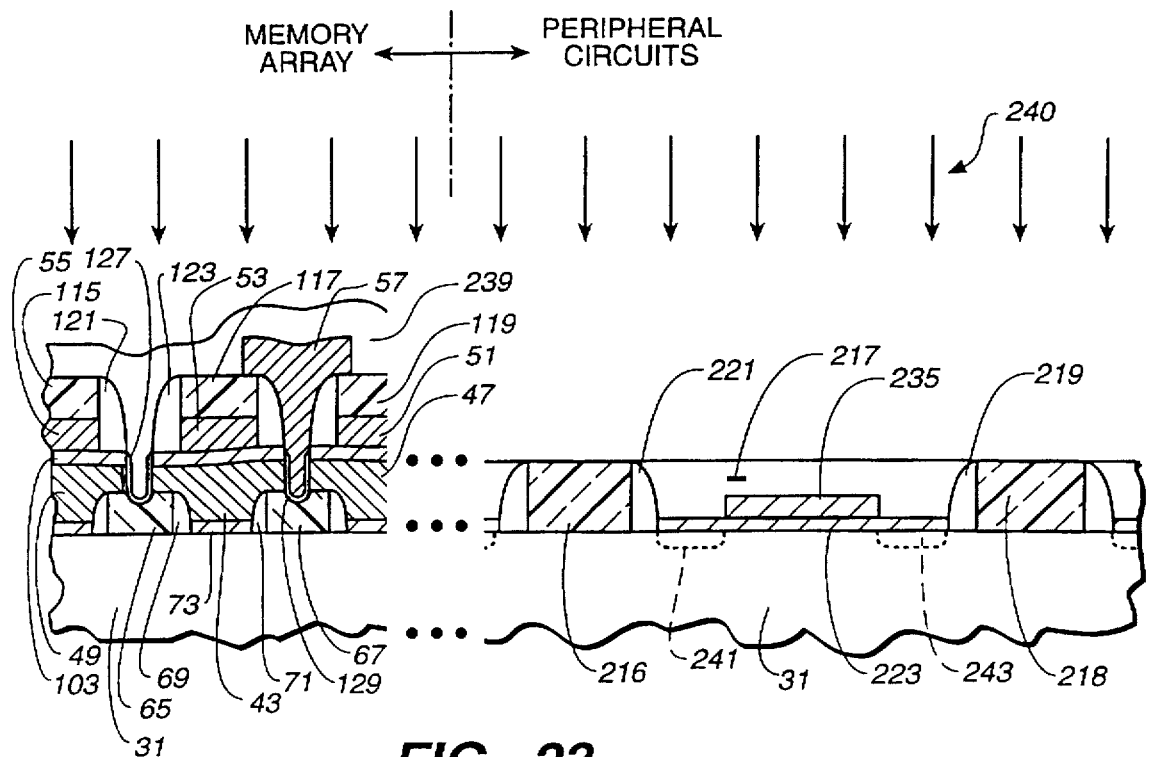
FIG._23
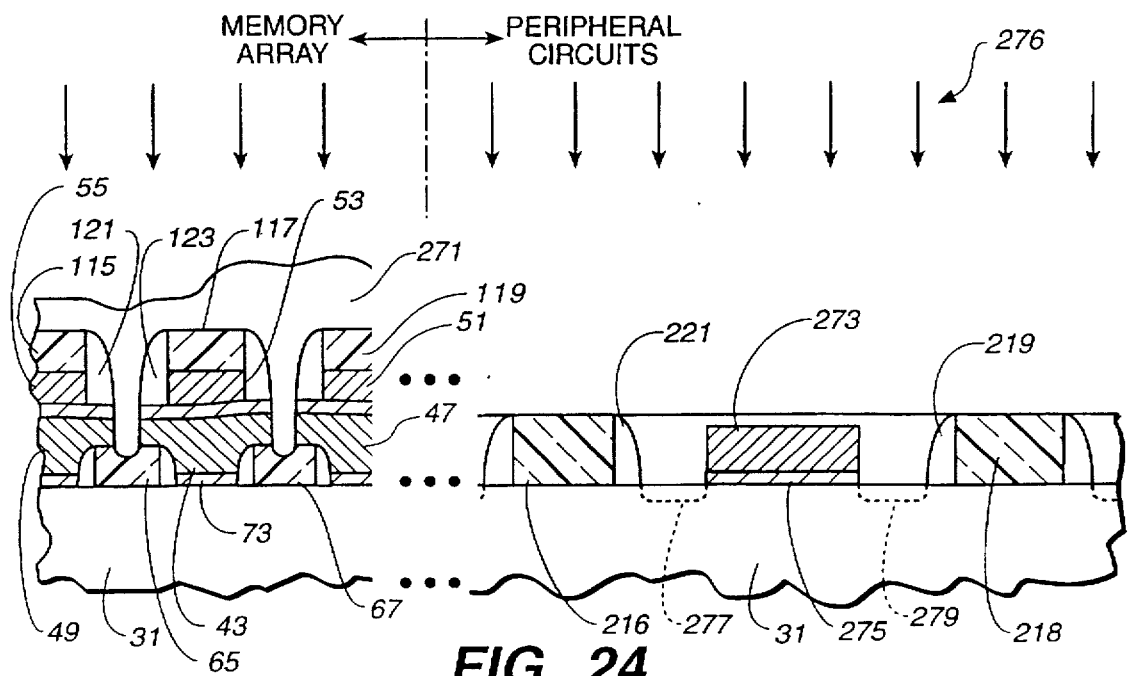
FIG._24

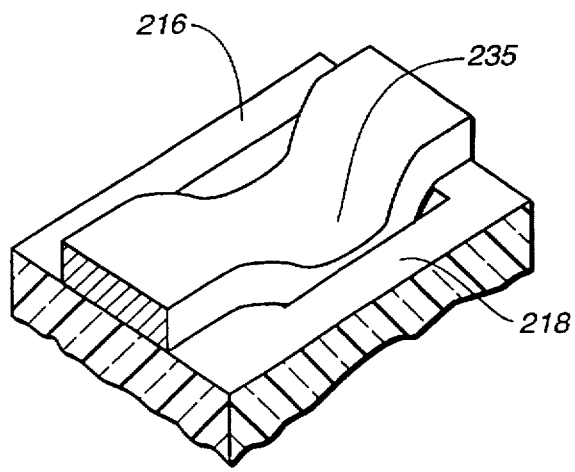
FIG._25
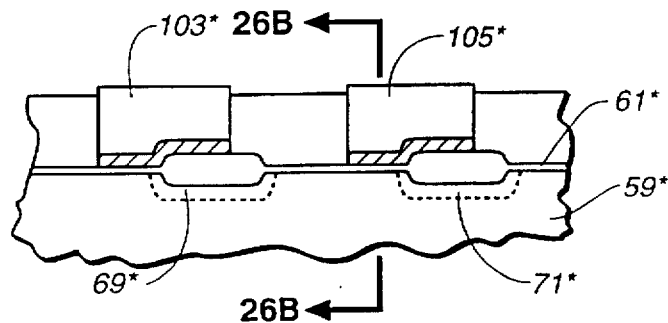
FIG._26A
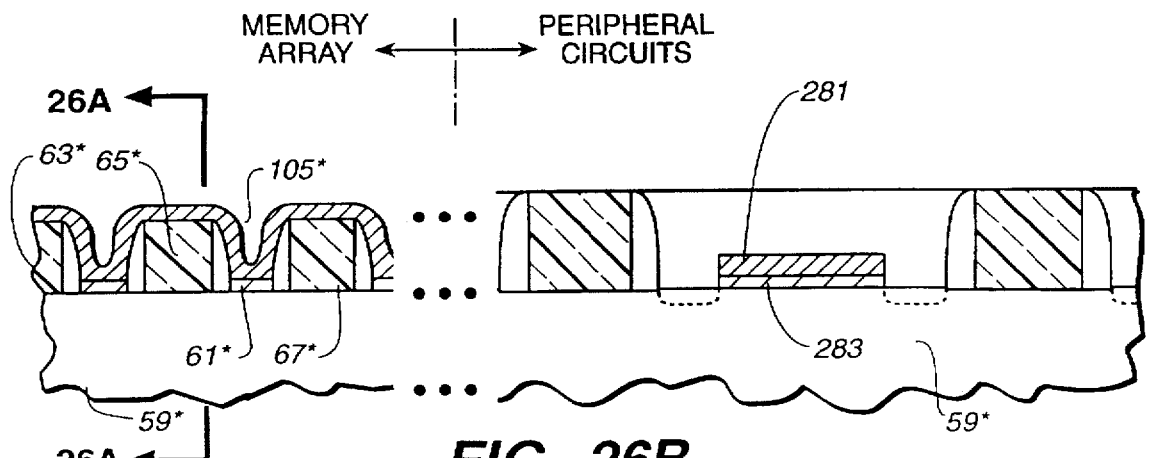
FIG._26B

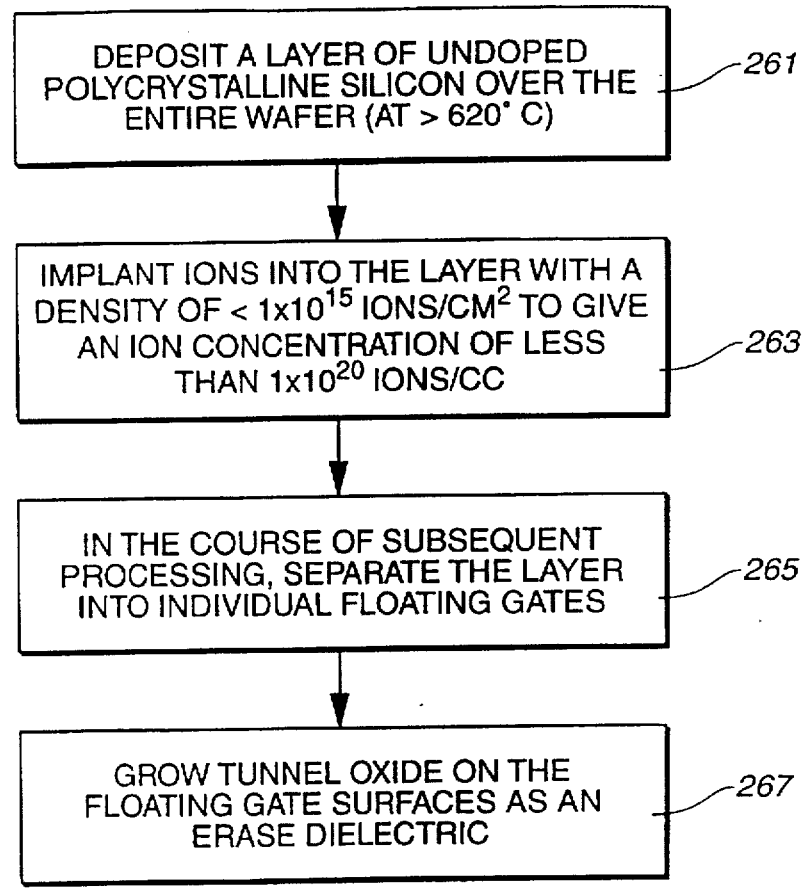
FIG._27
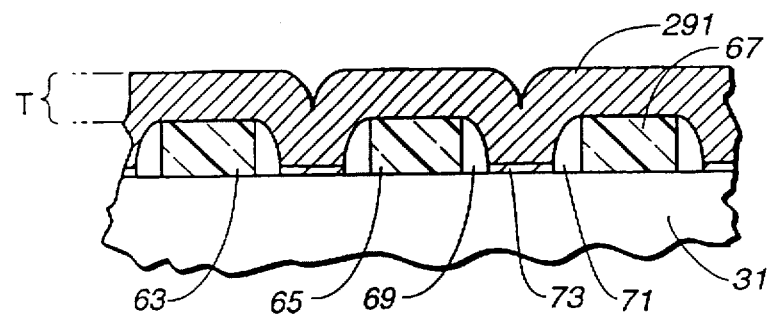
FIG._28
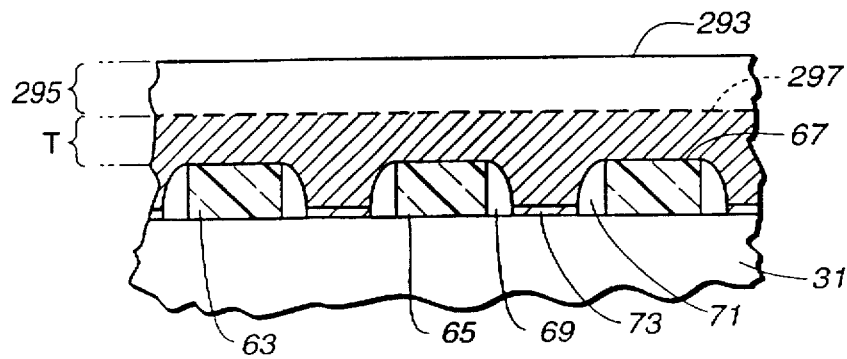
FIG._29

5,756,385

DENSE FLASH EEPROM CELL ARRAY AND PERIPHERAL SUPPORTING CIRCUITS FORMED IN DEPOSITED FIELD OXIDE WITH THE USE OF SPACERS

This is a division of application Ser. No. 08/414,333, filed Mar. 30, 1995, now U.S. Pat. No. 5,534,456 which in turn is a division of parent patent application Ser. No. 08/248,735, filed May 25, 1994 now U.S. Pat. No. 5,661,053.

BACKGROUND OF THE INVENTION

This invention relates generally to arrays of non-volatile memory cells which each includes a field effect transistor with a floating gate, and, more specifically, to EEPROM and flash EEPROM arrays and processes of forming them.

Field effect transistors having floating (unconnected) gates have long been utilized to form a non-volatile, semiconductor memory. Electrons are moved onto or removed from the floating gate of a given transistor memory cell in order to program or erase its state. The state of such a transistor memory cell is determined by applying a voltage across its source and drain and then measuring the current which passes through the transistor. The programmed level of charge on the floating gate is retained for a long period of time, essentially indefinitely. Memory arrays of such transistor cells are commonly available in various forms, such as PROMs, EPROMs, EEPROMs and flash EEPROMs. Currently, flash EEPROM technology is being used for large capacity semiconductor non-volatile memory, either in place of, or in combination with, a magnetic disk drive memory system.

Typically, such a semiconductor memory system is made up of a number of integrated circuit chips that each contain a two dimensional array of EEPROM cells, plus other integrated circuit chips providing a controller and other system operating support. A typical memory array integrated circuit chip includes elongated, spaced apart source and drain regions formed in a surface of a semiconductor substrate. These source and drain regions form the bit lines of the memory. A two dimensional array of floating gates has each floating gate positioned in a channel region between adjacent source and drain regions. An elongated control gate is positioned over each row of floating gates in a direction transverse to the source and drain regions. The control gates are the word lines of the memory array.

One type of cell used in such a memory array extends each of its floating gates over only part of its channel between the source and drain regions, while the control gate is positioned over the remaining portion of the channel. This is termed a "split-channel" type of EEPROM cell and effectively connects a select transistor in series with the floating gate transistor in order to isolate the floating gate transistor from the bit lines when its control gate (word line) is not active. An alternative type of EEPROM cell extends its control gate completely across the channel region, thus eliminating the select transistor and allowing the memory cell to be made smaller. However, the absence of the select transistor in each cell places additional constraints on operating a memory array of such cells.

One class of EEPROM devices employs an erase gate positioned adjacent the floating gate of each cell, with a thin dielectric therebetween, in order to transfer electrons from the floating gate to the erase gate when all the relative voltages are appropriately set. Flash EEPROM systems use a common erase gate for a sector or other block of cells, thus enabling their simultaneous erasure in a "flash." An alternative class of EEPROM devices does not use the separate erase gate, but rather removes the electrons from the floating gate through the substrate when all the appropriate voltages are set. In such flash EEPROM systems, the sectors or other blocks of cells are isolated from one another on the substrate in order that the individual blocks may be selectively and individually erased.

Regardless of which type or class of EEPROM cell is being utilized, a great deal of development effort is being directed to reducing the size of the individual memory cells, and thus increasing their density, in order to increase the memory capacity of each integrated circuit chip. It is desired that the capacity of an entire memory system of a given physical size, such one as formed on the currently popular PCMCIA plug-in cards, be increased. Therefore, it is the principal object of the present invention to provide cell structures and processes of forming them which reduces the size of the individual cells and thus increases the storage capacity of memory systems utilizing them.

It is another principal object of the present invention to form elements of the memory cells and peripheral transistors on the same integrated circuit chip with a resolution that is greater than that which results from using of state of the art processing techniques.

A further object of the present invention is to provide a flash EEPROM array with a longer cycle life.

It is also an object of the present invention to provide a flash EEPROM array which can be erased with reduced voltages.

Another object of the present invention is to improve the process by which the peripheral transistors and other circuit elements surrounding an array of memory cells are formed.

Yet another object of the present invention is to provide an improved coordination in the processes of forming memory cells and peripheral transistors as part of a common integrated circuit.

Still another object of the present invention is to provide improved techniques of forming field (thick) oxide in integrated circuits.

Also, it is an object of the present invention to be able to form on a rough surface a thin layer of material which has a smooth top surface.

SUMMARY OF THE INVENTION

According to one aspect of the present invention, the width of a mask used during ion implantation into the semiconductor substrate to form source and drain regions is reduced below that which is possible by an ordinary application of state of the art processing techniques, and the implantation dose is much less than normally used. After temperature elevations incurred in subsequent processing steps causes the width of these implanted regions to increase by ion diffusion, resulting widths of the source and drain regions in the finished product are significantly less than those obtained by existing techniques. An excessive width of the source and drain regions is thus avoided, and the overall size of the cell reduced. The mask for the ion implantation is formed by first depositing a dielectric layer on the substrate and then forming sharp openings therein which are as small as possible in at least one dimension with standard photoresist mask and dry etch technology. After that, dielectric spacers are formed along the sidewalls, thus reducing the width of the openings. In one embodiment, once ions are implanted in the substrate through these reduced size openings, both dielectric layers are removed. The rest of the memory array is then constructed on the substrate wherein the source and drain regions have been implanted.

According to a second aspect of the present invention, as a variation of the first aspect, a first polysilicon layer is deposited prior to the ion implantation in order to provide self-alignment of the source and drain implants with the floating gates of the cells that are formed from this first polysilicon layer. A protective dielectric layer is then deposited on the first polysilicon layer and both have elongated channels etched through them with a width that is as narrow as possible, given the resolution limitations of current photolithography techniques that define the masks used. Dielectric spacers are then formed on the inside walls of both the first polysilicon layer and the dielectric layer in order to decrease the width of the opening for the subsequent ion implantation step and to mask exposed sidewalls of the polysilicon material. Ion implantation into the polysilicon material through its sidewalls is thus avoided. The protective dielectric layer on top of the polysilicon layer prevents such ion implantation into the top surface of the polysilicon layer. The result is the self-alignment of the ion implantations precisely in the middle of the channel formed in the first polysilicon layer, thereby self-aligning the source and drain diffusions with the floating gates which are later formed from the polysilicon layer. Since the initial implantation is so narrow and the implant dose low, the floating gates need not be further separated in order to take into account subsequent enlargement of the implanted regions by lateral ion diffusion.

According to third aspect of the present invention, field oxide is deposited on the substrate prior to depositing the first polysilicon layer or implanting the source and drain regions. Field oxide is deposited and then formed by dry etching into strips having sharp walls and elongated in a direction transverse to the lengths of the source and drain regions that are to be later implanted. By forming the field oxide strips with sharp edges prior to the source and drain implantation step, the geometry of the cells may be made smaller. An alternative technique of thermally growing field oxide, for example, forms a well known "birds beak" of thin oxide edges with attendant difficulties and the consumption of a great deal of space. When the techniques of the preceding inventive aspect are also utilized, the protective dielectric and dielectric spacers can be made of a doped oxide or other material that is wet etched at a much higher rate than is the field oxide, thereby not attacking the field oxide during the dielectric etching step, especially the oxide positioned under the strips of polysilicon.

Another advantage of forming the field oxide strips at an early stage in the process is that the height of the polysilicon formed across the strips is necessarily increased in regions between the strips. This has an advantage that a later oxide fill and etch back of that oxide to the top of the polysilicon strips will not inadvertently etch too close to the substrate, thereby reducing the chance of failure of the device by arcing between later formed gates and the substrate. As a result, this etch back step does not require that the thick oxide layer first be planarized by the deposition of a photoresist layer, or otherwise, in order to prevent etching into the space between the polysilicon strips. This is because there is enough oxide therebetween to adequately form a buffer.

As part of this third aspect of the present invention, the spaces between the oxide strips can be made smaller than possible by normal state of the art techniques through the use of spacers along the sidewalls, thus making the width of the channels of the individual cells less than would normally result within the resolution limitations of current etch masks photolithographically formed.

According to a fourth aspect of the present invention, control gates are formed as strips of polysilicon material having lengths extending transverse to the lengths of the source and drain diffusions and with spaces between them that are less than possible by normal application of state of the art processing techniques. This is accomplished by forming spacers along sidewalls of an etched dielectric mask positioned over the second deposited polysilicon layer. That layer is then etched through the reduced openings and thus reduces the space between the resulting control gates. This then increases the width of the control gates, without increasing the size of the memory cell, with a result of a higher coupling area between adjacent control gates and floating gates.

According to a fifth aspect of the present invention, the floating gates of EEPROM cells are formed from polycrystalline silicon which is initially deposited in undoped form but then subsequently doped by an ion implantation process. This allows the level of doping to be accurately and uniformly controlled, even when a large number of wafers are being processed at the same time. This ability to control the doping level is used to make that level very low in the polysilicon layer from which the floating gates are formed. The doping level is made high enough for the floating gates to function properly to acquire and store electrons but low enough to improve the characteristic of a tunnel erase oxide layer that is grown on the floating gates to interface with corresponding erase gates. By lowering the doping level of the floating gate, less dopant will diffuse into the erase oxide layer and the resulting level of dopant in the erase oxide is reduced. This allows the layer to be made thinner, and this in turn allows lower erase voltages to be used. Fewer impurities in the erase dielectric also increases the number of erase cycles that the memory cells can endure, thus increasing the life of the memory.

According to a sixth aspect of the present invention, an integrated circuit chip is formed with field oxide that is provided with different thicknesses in various defined regions of the integrated circuit chip. A circuit portion including transistors (those of memory cells or otherwise) and other elements are formed with a field oxide thickness that is best suited to that portion. An initial layer of field oxide is formed, followed by increasing the field oxide thickness in certain portions of the circuit defined by a mask. The field oxide is then anisotropically etched within the resolution capabilities of existing techniques, thereby producing openings with sharp vertical sidewalls in which individual devices are formed. This is followed by the formation of spacers along the sidewalls in order to provide a smooth transition to receive the next layer, and, in some cases, to further reduce the size of the openings beyond that possible with the etching process alone. The formation of circuits by this process in a region peripheral to a memory array having a uniform thickness field oxide is itself part of this aspect of the present invention. But the process is of particular, advantage in flash memory chips wherein the memory array and peripheral circuit regions are formed with field oxide of different thicknesses. Many processing steps are performed simultaneously within the memory array and peripheral regions. Other processing steps are performed in one region at a time while the other remains covered by a protective mask that is later removed.

According to a seventh aspect of the present invention, a thin polysilicon layer is formed over a rough surface in a manner that results in a smooth top surface to support further circuit layers. Usually, deposition of such a thin polysilicon layer to only the thickness desired will result in the top surface being nearly as uneven as the surface upon which it is deposited. The present invention, on the other hand, deposits the polysilicon layer to a thickness much greater than that ultimately desired, sufficient for the top surface to be substantially smooth. A uniform thickness portion of the polysilicon is then removed, leaving a layer of the desired thickness with a planar surface. This removal is preferably accomplished by oxidizing the top portion of the deposited polysilicon and then stripping off the oxide.

The forgoing improvements in the process of making a flash EEPROM array, and the resulting structure itself, may be employed in any of the various types and classes of flash EEPROM systems described above in the Background section, except where limited in this Summary to a specific type or class. Applications to specific flash EEPROM arrays are given in the following description as examples of the various aspects of the present invention. This description should be taken in conjunction with the accompanying drawings.

BRIEF DESCRIPTION OF THE DRAWINGS

FIGS. 1–5 show in cross-sectional views sequential steps in masking and implanting source and drain regions within a semiconductor substrate, according to a first embodiment;

FIG. 6 is a plan view of primary components of a flash EEPROM array formed by the various aspects of the present invention, according to a second embodiment;

FIGS. 7A–7C, 8A–8C, 9A–9C, 10A–10C, 11A–11C, 12A–12C, and 13A–13C show cross-sectional views of the memory array of FIG. 6 at sequential steps in the processing which forms such an array, the "A" view of each of these figures being taken across section A—A of FIG. 6, view "B" of these figures taken across section B—B of FIG. 6 and section "C" of these figures taken across section C—C of FIG. 6;

FIG. 14 illustrates, an isometric view, some major components of the flash EEPROM array of FIG. 6, as formed by the processing steps illustrates in FIGS. 7–13;

FIGS. 15–17 illustrate in sequential cross-sectional views of the flash EEPROM of FIG. 6, taken at section C—C thereof, of processing steps that are an alternative to those illustrated in FIGS. 12C and 13C, as a third embodiment;

FIG. 18 is a plan view of a layout of an integrated circuit chip having a memory array in four quadrants and surrounding peripheral circuits that operate the array;

FIGS. 19–23 illustrate in sequential cross-sectional views of the integrated circuit of FIG. 18, taken at section 19—19 thereof;

FIG. 24 is a cross-sectional view showing a variation of the process of FIGS. 19–23 to make the integrated circuit of FIG. 18, taken at section 19—19 thereof;

FIG. 25 shows essential components of a peripheral transistor constructed in a manner illustrated in FIGS. 19–24;

FIGS. 26A and 26B illustrate use of the peripheral circuit formation techniques of FIGS. 19–24 to make an integrated circuit chip of FIG. 18 with a memory array of a different type;

FIG. 27 outlines the steps of one process of forming a doped polycrystalline material for use as the floating gates of the EEPROM cells; and FIGS. 28 and 29 are cross-sectional views that illustrate an alternative technique for forming the first polysilicon layer.

DESCRIPTION OF THE PREFERRED EMBODIMENTS

First Embodiment

Referring initially to FIGS. 1–5, a technique is described for forming implants within a semiconductor substrate which have a reduced width and thus is quite useful for forming a flash EEPROM array with cells of a reduced size. In a first step illustrated in FIG. 1, a p-doped substrate 11 has a layer 13 of silicon dioxide formed on it by any one of several known techniques, a standard chemical vapor deposition (CVD) technique being preferred. The thickness of the layer 13 is made sufficient to block the ions subsequently directed against the substrate through openings formed in the layer 13. This thickness, for most applications, is generally made to be within a range of from 1,000 to 5,000 Angstroms.

A next step in the process, illustrated in FIG. 2, is to etch away portions of the oxide layer 13 in order to form openings therethrough, such as an opening 15. In a specific application of this technique, these openings are elongated in a direction perpendicular to the drawing sheet but formed with a width W that is as small as possible under current state of the art techniques. In order to obtain sharp sidewalls in these openings, etching is accomplished through a photoresist mask (not shown) by a dry anisotropic etch process. Suitable techniques include reactive ion (RIE), electron cyclotron resonance (ECR), or other high selectivity directional etch technique. The minimum width W of these openings is limited by the resolution capability of the photolithography technique used to form the mask defining these openings. When made as small as possible, the distance W is substantially equal to the smallest element that the photolithography process can resolve.

In order to narrow the width W of these openings in the oxide layer 13, another layer 17 of silicon dioxide is deposited over the etched oxide layer 13, as illustrated in FIG. 3. The thickness of the layer 17 is controlled to be something less than one half of the width W, in order for this layer to conform to the sidewalls of the openings in the layer 13 without filling it. A next step is to anisotropically etch the layer 17 away to leave only portions of the oxide layer 17 adjacent such sidewalls, such as in the form of spacers 19 and 21 along sidewalls of the opening 15, as illustrated in FIG. 4. This then narrows the opening to a smaller width W'. A mask is then formed with this narrow opening through which ions are implanted by standard technique, as indicated by the downward facing arrows 23. The result is the formation of narrow n+ implant regions through each of these narrowed openings, such as a region 25. The initial width of each of the implant regions is W'. A typical implant 23 is accomplished with arsenic ions at a density of from $1 \times 10^{15}$ to $1 \times 10^{16}$ ions per square centimeter, at an energy of from 20 to 100 kev.

After the implant, all of the remaining dielectric mask layers 13 and 17 are removed from the substrate 11. Desired integrated circuit elements are then formed on the cleaned substrate, indicated in FIG. 5 generally as a non-specific structure 27. As the circuit structure 27 is formed on the substrate 11 by standard techniques, its temperature will likely be elevated to high levels at several different times. This results in the implanted ions diffusing both vertically and laterally. This diffusion significantly increases the width of the implanted regions, as shown by the enlarged region 25' in FIG. 5. Spacing between adjacent implanted strips forms the length of a memory cell transistor channel, in a specific application of this technique. If the diffused implanted regions of the resulting structure are larger than necessary, the size of the memory cell in the direction shown in FIG. 5 is then unnecessarily increased. Thus, the ability to implant a very narrow region maintains the width of the eventual expanded source/drain regions to be less than what would otherwise occur, a significant advantage in minimizing the memory cell size.

The width W' of the narrow implantation opening of the mask shown in FIG. 4 is controlled by the thickness of the dielectric layer 17 that is deposited (FIG. 3). The thicker the layer 17 is made, the narrower the opening W' becomes, until, at a thickness of about one-half W (FIG. 2), this opening width W' approaches zero. This width w, and thus the thickness of the dielectric layer 17, is chosen to provide the desired resistivity along the length of the ion implanted regions in a direction perpendicular to the sheet of the drawings. The smaller the width w, the higher the resistance along such a length and thus metal contacts to these resulting source and drain regions must be made closer together along such a length. This technique allows the size of the resulting source and drain regions, after the inherent diffusion later occurs, to be minimized consistent with the need for a desired resistivity.

Second Embodiment

FIGS. 6–14 illustrate the process of forming an array of a specific type of flash EEPROM cell on a semiconductor substrate, and the resulting structure. The specific type of memory cell being illustrated extends its floating gate across the entire channel length, between adjacent source and drain regions. That is, no select transistor is provided as part of these cells, as it is in a split-channel type of EEPROM cell.

Referring initially to FIG. 6, a plan view of a portion of such a memory cell array formed on a semiconductor substrate 31 is illustrated. For the purpose explaining the process and structure of FIGS. 6–14, two directions "X" and "Y" are defined, as shown in FIG. 6, to be substantially orthogonal to each other. Implanted source and drain regions 33, 35, 37 and 39 are illustrated by center lines extending along the lengths of these regions, in the Y direction. Positioned in between adjacent source and drain regions are the floating gates of individual memory cells, such as one row of floating gates 41, 43, and 45, extending in the X direction. Floating gates also extend in the Y direction, such as a column of floating gates 47, 43 and 49. A two dimensional array of floating gates is thus shown. A control gate extends across each row of floating gates, as shown by control gates 51, 53 and 55. The control gates are elongated in the X direction and spaced apart in the Y direction.

In the embodiment being described, erase gates are utilized, erase gates 57 and 61 being shown in FIG. 6. The erase gates are also elongated in the X direction and spaced apart in the Y direction. The erase gates are field coupled to each of the floating gates within a sector or block of memory on a given integrated circuit chip. This then requires that an erase gate be positioned in only every other space in the Y direction between control gates, but can be included in each such space in order to couple each floating gate with two erase gates, if desired. This form of cell is often referred to as a "triple polysilicon" type since three gates are utilized, all of which are formed of electrically conductive doped polysilicon. The advantages of the various aspects of the present invention can, however, be alternatively realized by "double polysilicon" EEPROM cell arrays wherein the floating gates are erased through the substrate rather than through a separate erase electrode.

A preferred process for forming the array of FIG. 6 is described with respect to the cross sectional views of FIGS. 7–13. Each of these figures illustrate the structure at different stages in the process of forming the array, and includes three views of the structure of FIG. 6. For example, FIG. 7A is a cross sectional view of the array of FIG. 6 across section A—A thereof at one stage in its construction, FIG. 7B a view across section B—B of FIG. 6 at the same stage of construction and FIG. 7C a view across section C—C of FIG. 6 at that same stage of construction. The same convention is used to show the structure of the array at each of six additional stages of construction in the FIGS. 8–13. FIG. 14 is an isometric view of a resulting structure but shows only its major components, for ease of understanding.

Referring now to FIGS. 7A, 7B and 7C, the first several processing steps are described. Strips 63, 65 and 67 of oxide are first formed directly on a surface of a p-doped substrate 31. These oxide strips, being elongated in the X direction and spaced apart in the Y direction, form the field oxide between adjacent rows of cells. As explained later, this field oxide assures that the erase gates will not be formed dangerously close to the substrate 31 and to increase the height of the floating gates in order to allow for an adequate dielectric fill between the floating gates that prevents breakdown from the control and erase gates to the substrate 31. By forming the field oxide strips first, the floating gates and other elements of the structure can then be self-aligned to the field oxide.

The field oxide strips 63, 65 and 67 are preferably formed by first forming silicon dioxide over all of the substrate 31 to a thickness of from 1,000 to 3,000 Angstroms, a CVD process being preferred but other known processes of forming thick oxide layers also being usable. A photoresist mask is then formed on top of this layer for a subsequent dry etch in order to separate the layer into its strips. The strips are spaced as close together as permitted by the resolution limitations of the photolithography process employed to define them. The spaces between the strips become the widths of channels of the individual memory cells. In order to reduce those widths further, spacers are formed, such as spacers 69 and 71, by the same process as described above with respect to FIGS. 3 and 4. In this case, however, nearly all of the oxide strip and spacer material remains as a permanent part of the structure and is thus made of undoped silicon dioxide. A typical gap between adjacent strips in the Y direction is about 0.4 micron, the spacers is being used to reduce that to about 0.2–0.3 micron.

A next processing step is to grow a high quality gate oxide on the surface of the substrate 31 in between the oxide strip/spacers. This forms the gate dielectric for the floating gates, and is grown to a thickness of about 100 to 300 Angstroms. This gate oxide is shown in FIG. 7C, a strip 73 elongated in the X direction being exemplary.

The next several processing steps can be understood by reference to FIGS. 8A, 8B and 8C. The next step is to form strips of doped polysilicon, such as strips 75, 77 and 79, elongated in the Y direction and spaced apart in the X direction. These strips are formed by depositing a layer of polysilicon about 2,000 to 4,000 Angstroms thick over the entire structure, thus filling in between the field oxide strips as shown in FIG. 8C. The elongated strips are then formed by standard photoresist mask and etching techniques, the space between these strips in the X direction being made as small as this process permits, that being about 0.4 to 0.5 micron. The width of the polysilicon strips is similarly made to about the same minimum dimension. These polysilicon strips are separated along their lengths in later steps into individual floating gates.

Prior to masking and etching the first polysilicon layer into strips, as shown in FIGS. 8A, 8B and 8C, it is desired to deposit a layer of doped oxide on the polysilicon layer so that they will be etched together in order to form strips 81, 83 and 85 of doped oxide on top of the polysilicon strips. The purpose of these doped oxide strips is to protect the polysilicon strips from having ions implanted in them during a subsequent ion implantation of the source and drain regions in the substrate. By forming this masking oxide layer prior to etching the first polysilicon layer, it is assured that the polysilicon strips are adequately covered without extending the protective layer into spaces between the strips. As is seen later, the protective dielectric strips 81, 83 and 85 are removed from the structure after the substrate ion implantation. This dielectric layer is deposited on top of the polysilicon to a thickness of around 2,000 Angstroms, the thickness being chosen sufficient to block ions from being implanted in the polysilicon strips.

A next step is to form dielectric spacers in between the polysilicon strips in order to form narrow slits between these strips through which ions are permitted to be implanted into the substrate. A first step in forming these spacers is to deposit a layer of doped oxide 87 over the entire structure to a thickness that is something less than one half the distance between the polysilicon strips in the X direction. The next step is to anisotropically etch the layer 87 in a manner to form spacers shown in FIGS. 9A and 9B, such as spacers 89 and 91 that form a narrow strip through which ions are implanted as indicated by arrows 93 into narrow regions in the substrate 31, such as the narrow strip 37 that is elongated in the Y direction. The width of the mask opening for each strip implantation is made to be as small as possible, within a range of from 0.1 to 0.2 micron.

The implantation step preferably implants arsenic ions with a dose of from $1 \times 10^{14}$ to $2 \times 10^{15}$ ions per square centimeter at about 40 kev. This is a much lighter dose than is usually employed to form source and drain implants. The following combination of steps is significant: (1) first forming trenches by a dry etch process in the field oxide that are as narrow as can be made within the resolution limits of the best photolithography technique, (2) then reducing those widths further by the use of spacers, and (3) followed by a lighter than usual ion implant into the substrate through the reduced width openings. This provides very narrow implants with fewer ions to migrate laterally during subsequent heating steps. The widths of the source and drain regions of the completed circuit are thus minimized, contributing significantly to being able to minimize the geometry of the memory cells. Any difficulty with the added resistance of the elongated implanted regions, due to the reduced ion concentration, can be overcome by increasing the frequency of contacts along their lengths from a metal conductor in another layer.

Since the protective oxide strips 81, 83 and 85 need to be removed after the ion implantation has taken place, the material deposited to form those strips is preferably doped oxide or nitride. This needs to be removed in order to later form the control gates on top of the floating gates with an appropriate gate dielectric between them. The spacers shown in FIGS. 9A, 9B and 9C, in addition to forming a part of the ion implantation mask, also serve to protect the sidewalls of the polysilicon strips from ions being implanted into the polysilicon. It is preferable that these spacers also be removed after the ion implantation step. Therefore, the deposited layer 87 (FIG. 8A) from which the spacers are formed is also made to be a doped oxide or nitride.

The doped oxide preferred for making these temporary masking elements is very hygroscopic and therefore easily dissolved in a wet etch solution. It is desired that the material can be removed by such an etching step at a rate of at least 50 times, and preferably over 100 times, the rate at which that same etching solution removes the field oxide of the strips 63, 65 and 67 and the spacers attached to them. It is particularly undesirable for the field oxide to be removed from beneath the polysilicon strips which later become the floating gates. The preferred doped oxide for the masking strips 81, 83 and 85, and the layer 87 from which the spacers are formed, is a silicate glass doped with either boron or phosphorous, or both, within a range of about 2–9 percent by weight. These materials are commonly known, respectively, as BSG, PSG and BPSG. Because this doped oxide material is in contact with the polysilicon strips, it should be removed in order to prevent diffusion of dopant from it into the polysilicon during later steps at elevated temperatures. Other materials may alternatively be used for these masking layers so long as they may be selectively etched, such as silicon nitride which can be selectively removed by hot phosphoric acid. In a modified structure, one of the top mask layer or side spacers may be retained in the structure so are made of silicon dioxide, a further modification forming both of them from silicon dioxide.

It will be noted, particularly from FIGS. 8B and 9B, that the step of etching the layer 87 in order to form the spacers, such as the spacers 89 and 91, also involves removal of a portion of the field oxide strips which lie under the layer 87. This is necessary in order to clean the substrate surface in the narrow strips defined by the spacers for the subsequent ion implantation step. Thus, this etching step must remove some field oxide as well as the doped oxide of the layer 87. It will be noted, however, that the amount of material 97 (FIG. 8B) to be removed by this etching step where the field oxide strip 67 exists is much greater than a thickness 95 (FIG. 8A) of the layer 87 alone. Thus, in order to remove all of the filed oxide in the narrow regions between the polysilicon strips, the substrate surface will be subjected to etching in portions of that region where field oxide does not exist (such as the region 95, FIG. 8A). However, the etching process is chosen to attack the oxide material (both doped and undoped) much more intensely than it does the silicon substrate. A differential etch rate of 20 to 1, or more, is chosen. The preferred etching process for this step is a dry etch, which provides these characteristics. Thus, very little of the substrate material is removed. This does, however, present a limitation on the maximum thickness of the field oxide strips 63, 65 and 67 that is desirable.

FIGS. 10A, 10B and 10C show the state of the structure after the temporary masking elements have been removed. After such removal, the structure is annealed in order to repair damage caused by the ion implantation step, as is common. A layer 101 of undoped silicon dioxide is then deposited to a thickness of from 2,000 to 5,000 Angstroms. This step is performed primarily to fill in the regions between the polysilicon strips 75, 77 and 79 and thus must have a thickness of more than one half the distance between adjacent polysilicon strips.

The next step is to etch back the oxide layer 101 to expose the top surfaces of the polysilicon strips 75, 77 and 79. Indeed, it is desired to over etch by about 30 percent in order to make sure that the oxide has been completely removed from the tops of the polysilicon strips. Because the channels between the polysilicon strips that are being filled with the oxide 101 have been deepened by forming the polysilicon strips on top of the field oxide strips, there is little danger that this amount of over etching will cause this oxide to be so thin as to cause failures to the device by shorting through that oxide to the substrate from control and erase gates which are later formed on top of it. Thus, no planarization of the oxide layer 101 (FIGS. 10A, 10B and 10C) is necessary prior to this etching step. Such planarization is often done by coating smooth the uneven exposed surface of such an oxide layer with a material (such as a photoresist) having essentially the same etch rate as the oxide layer 101.

With reference to FIGS. 11A, 11B and 11C, a thin dielectric layer 103 is then formed over the entire structure in order to provide a gate dielectric between the polysilicon strip 75, 77 and 79 and control gates later formed thereon from a second polysilicon layer. The dielectric 103 is preferably formed of three layers, a thin oxide, a nitride and then another oxide on top. This form of gate dielectric is well known.

As a next step, the second polysilicon layer is deposited over the gate dielectric layer 103, followed by depositing on that second polysilicon layer a undoped silicon dioxide layer. Each of these two layers is made to be about 2,500 Angstroms in thickness. With reference to FIGS. 12A, 12B and 12C, a photoresist mask (not shown) and etchant is then used to separate both of these layers into strips. The second polysilicon layer is separated into strips 51, 53, 55 and 56 by this process. Similarly, corresponding oxide strips 113, 115, 117 and 119 are formed directly thereover from the deposited oxide layer. These corresponding polysilicon and oxide strips are elongated in the X direction and spaced apart in the Y direction. The photoresist mask used to etch the second polysilicon and its cover oxide layers into these strips is positioned with respect to the rest of the structure already formed so that the gaps between these strips in the X direction overly the field oxide strips 63, 65 and 67 (as shown in FIG. 12C).

These recently formed strips are then used for alignment of an etch of the first polysilicon strips 75, 77 and 79 into the individual memory cell floating gates. In order to remove as little of the first polysilicon layer material as possible, the next step is to form spacers in the gaps between the second polysilicon strips 105, 107, 109 and 111, such as spacers 121 and 123. (FIG. 12C) These spacers are formed by depositing an oxide layer having a thickness of about 1500 Angstroms, and then anisotropically etching it. The oxide encapsulation of the polysilicon strips 51, 53, 55 and 56 serves as a mask to define areas of the first polysilicon layer strips to be removed, this having been accomplished in the next view of FIG. 13C. Alternative to the use of oxide to form the spacers, examples being spacers 121 and 123, silicon nitride may be used since it has an advantage of being very conformable to the shape of the underlying surfaces and is relatively resistant to any later wet etching steps. Other dielectric material is suitable as well, examples being oxynitride, plasma oxide or nitride.

It will be noted from FIG. 13C that the field oxide strips 63, 65 and 67 protect the substrate from damage. These field oxide strips also maintain a desired distance between erase gates which are subsequently formed in the etched channels and the substrate without having to take any other elaborate precautions.

The embodiment being described herein is of a "triple polysilicon" type; that is, separate conductive erase gates are formed, such as the erase gates 57 and 61 shown to be elongated in the X direction and spaced apart in the Y direction. It will be noted, however, that many of the various aspects of the invention described so far with respect to the preferred embodiment can also be applied to flash EEPROM memory arrays that do not utilize separate erase gates.

Referring again to the structure shown in FIGS. 13A, 13B and 13C, a next step, after the first polysilicon strips are separated into their individual floating gates by being etched through, an erase dielectric is grown on the exposed ends of the floating gates resulting from the etching process. Erase gate oxide layers 125, 127 and 129 are shown in FIG. 13C. These oxide layers are grown to about 200 Angstroms in thickness. The third polysilicon layer is then deposited over the structure with a thickness sufficient to fill in the slots elongated in the X direction above the field oxide strips, as shown in FIG. 13C. This thickness is about 3,000 Angstroms. This third polysilicon layer is then separated into its elongated erase gates 57 and 61 by an appropriate photoresist masking and etching steps.

The structure shown in FIGS. 13A, 13B and 13C has incorporated the various aspects of the present invention and is a completed product, subject to further processing that includes the formation of one or more metal layers and conductive pads, passivation of the entire structure, and other such well known process steps. Each time the temperature of the structure is elevated after the source and drain regions have been formed, those narrow regions shown in FIGS. 9A and 9B gradually expand within the substrate, both downward and laterally, as the implanted ions diffuse. An attempt has been made to show the results of that diffusion in each of the steps of FIGS. 10–13. A resulting channel with 131 (FIG. 13A) results. If the initial ion implant regions are wider than initially provided by the present invention, then the resulting implanted regions take up a further magnified amount of space, thus increasing the size of each cell and decreasing the density of cells on a circuit chip.

In each of the steps involving the deposition of oxide, either doped or undoped, it is preferable that this be accomplished by a standard CVD process. Many such specific processes, involving the use of different gases and temperatures, are well known in the art. It is generally preferable to use the higher temperature processes for those steps where oxide is to be deposited on vertical surfaces since the resulting oxide layer usually better conforms to that surface than with the use of CVD processes at lower temperatures.

Third Embodiment

FIGS. 15–17 show a variation of the process described with respect to FIGS. 12C and 13C, in order to increase the area of coupling between the floating gates and control gates without increasing the size of the individual cell. Those elements of FIGS. 15–17 which are the same as those in FIGS. 12C and 13C are given the same reference numbers, and those which are different but correspond to such elements are denoted with the same reference number but a prime (') added. After the gate dielectric layer 103 has been formed, a layer 141 of polysilicon is deposited, followed by an oxide layer being deposited on that, similar to what was described with respect to FIG. 12C. However, in this case, the oxide layer and polysilicon are not separated in a common etching step into elongated strips. Rather, as shown in FIG. 15, the second polysilicon layer 141 remains in tact while the oxide layer on top of it is masked and etched into strips 113', 115', 117' and 119'. Spacers are then formed by the techniques described above, such as spacers 143 and 145, in order to reduce the space between the strips to something less than can be accomplished by the usual photoresist mask and etching step which has been implemented.

The second polysilicon layer 141 is then etched, as shown in FIGS. 16, using the oxide strips and spacers on top of it (FIGS. 15) as a mask. The result is that each of the polysilicon strips 51', 53', 55' and 56' are wider than in the embodiment of FIGS. 12C and 13C. This provides a greater area of coupling between the second polysilicon layer strips, which constitute the memory array control gates, with their underlying floating gates formed from the first polysilicon layer. This technique increases that coupling area within the resolution limitations of existing photolithography and etching processes and without increasing the size of the individual memory cells.

Referring again to FIG. 16, a further oxide layer is deposited and anisotropically etched back in order to form further spacers, such as spacers 147 and 149. This provides a narrow slit as a mask for etching through the first polysilicon layers strips, that having been accomplished by the state of the structure illustrated in FIG. 17. These latter spacers are also required to provide a electrical insulation between the control gate strips 51', 53', 55' and 56' and the later formed erase gates 57' and 61'. That is the same use of the oxide spacers 121 and 123 left in the structure by the process of FIGS. 12C and 13C, as well.

Formation of Peripheral Circuits

The foregoing discussion with respect to FIGS. 6–17 is directed to the formation of an array of memory cells on an integrated circuit chip. Of course, any such memory chip also carries other circuitry formed of ordinary transistors and other components. Such other circuitry includes sense amplifiers, bit line biasing circuits, and switching elements, as examples of just a few. FIG. 18 shows a layout of such an integrated circuit chip wherein such peripheral circuits are formed in a region 201, shown shaded in the figure, that surround four quadrants 203, 205, 207 and 209 of a memory array. What has been described with respect to FIGS. 6–17 is the formation of the memory array 203–209. FIGS. 19–24 illustrate the formation of the peripheral circuits in conjunction with formation of that memory cell array. FIGS. 19–23 are sectional views taken at section 19—19 of FIGS. 18, thereby showing the formation of memory cells on the left and formation of peripheral transistors on the right. The memory array formation shown on the left side of each of FIGS. 19–23 is the embodiment described with respect to FIGS. 7–13, but include intermediate views not given in those earlier figures.

Indeed, FIG. 19 shows the formation of a thick oxide layer 211 in the memory cell area of the chip, which is accomplished as one of the steps leading to the intermediate structure shown in FIG. 7. As part of this initial step of forming a field oxide layer, the area 201 of the chip carrying the peripheral circuits has an even thicker field oxide layer 213 formed. While the layer 211 in the memory array areas of the chip is made to have a thickness within a range of about 1,000 to 3,000 nominally being about 2,000 Angstroms thick, the layer 213 is made to be about twice that thick, within a range of about 2,000 to 6,000 Angstroms, nominally about 4,000 Angstroms thick. This added thickness reduces stray capacitance to the substrate from conductive elements formed on top of the field oxide 213, and also prevents formation of parasitic transistors from those same conductive elements. The oxide layers in FIG. 19 can be grown from the substrate 31 but it is preferable that they be deposited by a CVD process.

A preferred way of forming the field oxide shown in FIG. 19 is to deposit a layer of about 2,000 Angstroms over the entire chip, then mask off the peripheral circuits 201 (FIG. 18) and remove the field oxide from the memory array regions 203–209, preferably by a wet etching process but a dry etching process can alternatively be used. The mask is then removed from the peripheral circuit regions 201 and another layer of oxide of about 2,000 Angstroms is deposited over the entire chip, thereby to give the profile shown in FIG. 19.

Subsequent processing steps described with respect to FIGS. 7 and 8 are then performed in both the memory and peripheral circuit areas of the chip, namely removal of portions of the field oxide by a dry etch process, the formation of spacers along vertical walls or the remaining field oxide layers, the formation of gate oxide on the substrate in between such spacers and the deposition of the first polysilicon layer. The state of the process at that point is shown in FIG. 20, after a layer 215 of polysilicon has been deposited over the entire chip surface but before any dielectric is formed on it and before the polysilicon layer is separated into the strips shown in FIG. 8.

At the same time that the memory area field oxide layer 211 is separated into its strips, shown as 65 and 67 in FIG. 20, the thicker field oxide in the peripheral circuit area is simultaneously removed according to a different pattern in the region 201. The thicker field oxide 213 is masked simultaneously with the memory area field oxide, and openings formed in it by the dry etch process. One such opening 217 is shown in FIG. 20, with thick oxide portions 216 and 218 remaining on either side. The profile of the sharp walls is smoothed somewhat by forming spacers, such as spacers 219 and 221, at the same time and in the same manner as the spacers of the memory array, such as spacers 69 and 71 of FIG. 20. It then provides a surface to which other material formed in a subsequent step may more easily conform. It will be noted that the peripheral transistors illustrated in FIGS. 20–24 and 26B are larger than the memory cells, thereby not pushing the resolution limitations of the process to its limits, as in the case of the memory cells. The spacers do not, therefore, provide a higher resolution (narrower line width) in these peripheral transistors than is possible with ordinary lithographic and etching techniques. But the combination of forming openings as small as possible by dry etching the deposited field oxide 213 and then forming spacers along the sharp sidewalls of the openings in order to narrow them further, is useable to form a mask for ion implantation into the substrate when making other peripheral circuit elements requiring a small dimension in at least one direction, such as elongated resistors.

The first polysilicon layer 215 is then deposited over the entire chip. Before any of this layer is removed, the region 201 of the chip is covered with a masking layer 225 in order to prevent subsequent operations in the memory array from affecting the peripheral circuit regions. The material of the masking layer 225 is preferably photoresist but can be some other suitable material such as an oxide. The polysilicon layer 215 and the masking layer 225 protect the peripheral areas while the memory cell processing steps illustrated in FIGS. 8–12 are performed.

Referring to FIG. 21, the state of the memory array formation shown on the left is that of FIGS. 13A, 13B and 13C, except that the erase oxide layers 127 and 129 have not yet been grown and the third polysilicon layer has not yet been deposited. Thus, the erase gates 57 and 61 have not been formed. At the same time that the first polysilicon layer 215 in the memory area is separated into the floating gates 43, 47 and 49, the layer 215 in the peripheral areas is totally removed. What is then left in the peripheral areas of the chip is the partially formed transistor structure shown on the right hand side of FIG. 21. As an alternative to protecting the peripheral region 201 with the first polysilicon layer, it may instead be protected by depositing the second polysilicon layer over the peripheral region without depositing the first polysilicon layer thereover.

A layer of oxide is then grown in a manner to simultaneously form the tunnel oxide layers 127 and 129 in the memory array, and a gate oxide 223 in the peripheral transistors. The third polysilicon layer is next deposited over the entire chip. In the memory array regions of the chip, this third polysilicon layer is separated into the erase gates 57 and 61, in a manner previously described with respect to FIG. 13. In the peripheral circuit regions, the third polysilicon layer is masked so that the same polysilicon removal step leaves the peripheral transistor gates, such as a gate 235 indicated on the right hand side of FIG. 22.

As a next step, the memory array regions of the chip are covered with a photoresist layer 239, or other material that prevents ions directed against the entire chip from reaching any of the memory cell elements. Thus, as shown in FIG. 23, ion implantation indicated by arrows 240 is prevented by that layer from affecting the memory cell regions of the chip but do cause ions to be implanted in the substrate 31 to form source and drain regions of the peripheral transistors. Two such implanted regions 241 and 243 are shown on the right hand side of FIG. 23. They are self-aligned with the transistor gate 235. After the ion implantation, the masking layer 239 is removed from the memory array regions of the chip, thus producing the structure illustrated in FIG. 13 while at the same time having peripheral transistors formed to the point shown on the right hand side of FIG. 23. An enlarged isometric view of one such transistor is shown in FIG. 25, wherein the gate structure 235 extends downward into an opening formed in the thick field oxide.

Alternative to forming the peripheral transistor gates from the same polysilicon layer from which the erase gates are formed in the memory cells, the transistor gates could be formed from the second polysilicon layer of the memory cell array in the same manner. The peripheral circuit regions of the chip are then covered by a protective layer while subsequent processing steps are accomplished on the memory cell array.

As yet another alternative, the peripheral transistor gates can be formed directly from the first polysilicon layer 215 by selectively removing this layer in the peripheral circuit regions instead of totally removing it in the manner described above with respect to FIGS. 20–23. This alternative is illustrated in FIG. 24, wherein the memory structure on the left corresponds to the state of the process in FIG. 13C before the tunnel oxide layers 127, 129 and the third polysilicon layer are formed, the same as in FIG. 21. A protective masking layer 271 is also provided over the memory array portions of the circuit chip. Rather than the first polysilicon layer being completely removed, as in the embodiment of FIGS. 20–23, it is patterned so that such a removal leaves the gates of the peripheral transistors, such as the gate 273. Gate oxide layer 275 is also retained under the gate 273, having been grown at the same time as the floating gate oxide layer 73 of the memory cells. Before the first polysilicon layer is formed into the transistor gates, however, its conductivity is increased by an impurity diffusion or ion implantation process. This, as described in the next section with respect to FIG. 27, is because the first polysilicon layer is initially lightly doped consistent with the requirements of a memory cell floating gate. This light doping alone does not provide enough conductivity for an ordinary field effect transistor gate.

After the peripheral transistor gates are formed from the first polysilicon layer, the circuit is subjected to ion implantation, indicated by arrows 276 in FIG. 24, in order to form source and drain diffusions in the peripheral transistors, as indicated by the diffusions 277 and 279. The masking layer 271 is then removed from the memory array portion of the circuit, and the tunnel erase oxide layers (127 and 129 of FIG. 13C) of the memory cells and a thin oxide layer over the peripheral transistor diffusions (not shown) are simultaneously grown. The peripheral transistors are then substantially completed, having the same form as shown in FIG. 25. The peripheral circuits are then covered by another temporary masking layer while the third polysilicon layer is deposited on the memory array and separated into erase gates. In the case where the second polysilicon layer is used to protect the peripheral region 201, rather than the first polysilicon layer, the peripheral transistor gates may similarly be formed from the second polysilicon layer.

Although the methods of forming circuits peripheral to a memory array have been discussed above in conjunction with a type of memory cell that does not have a select transistor, the same methods are equally applicable for use during the formation of arrays having split-channel memory cells. Examples of split-channel memory cells formed within trenches anisotropically etched in thick field oxide are given in copending U.S. patent application Ser. No. 07/629,250, filed Dec. 18, 1990, now U.S. Pat. No. 5,343,063 and in a counterpart European patent application publication no. 491,581, dated Jun. 24, 1992, the contents of which are hereby incorporated herein by this reference. Peripheral circuits can be formed along with the memory cells of those applications in the same manner as described above.

As an example of this, FIG. 26A and the left side of FIG. 26B herein correspond to the orthogonal cross-sectional views of FIGS. 12A and 12B, respectively, of this earlier application, wherein the same reference numbers are used but with an asterisk (*) added. The first polysilicon layer is separated within the memory regions by etching into strips 103* and 105*, later to be further separated into individual floating gates. At the same time as this initial etching, the first polysilicon layer is selectively removed in the regions of the peripheral circuits to leave the transistor floating gates, such as the gate 281 of FIG. 26B. A gate oxide layer 283 was grown at the same time as the layer 61* of the memory cells. The thick oxide and spacers surrounding the transistor gate 281 were earlier formed in the same manner as described with respect to FIGS. 20–24. The field oxide was initially deposited in the peripheral area to a thickness greater than in the memory array area. Subsequent individual processing of one of the memory or peripheral areas is performed by masking the other. The peripheral transistor gates can alternately be formed from the second or third (if used) polysilicon layers.

Although the methods of forming transistors have been described with respect to FIGS. 19–26 for circuits peripheral to a flash memory array, the same techniques can be applied to the formation of transistor elements and other circuit elements peripheral to other types of semiconductor memory cell arrays. They can also be more generally applied. Further, more than two different field oxide layer thicknesses can be utilized in a single integrated circuit. Various areas of a circuit may be provided with a minimum thickness of field oxide that is required for the different areas. The need to provide a thick layer in one area in order to sufficiently separate conductors from the substrate, for example, does not then control the thickness of field oxide in areas where the field oxide need not provide such separation.

Also, much smaller features can be formed with the process of first depositing a thick field oxide layer, forming openings by a dry anisotropic etch process where individual circuit elements are to lie, and then to form spacers along the vertical side walls of these openings to reduce a dimension of them to something less than that which can be formed within the resolution limits of photolithography processes used to define etching masks and the precision of the etching processes. This is much superior to the usual technique of growing field oxide on a substrate that has first had the transistor channel regions covered by a silicon nitride masking material. This standard process, termed LOCOS, results in undesirable field oxide thickness variations, in the shape of a "birds beak," around the masked transistor channel regions. Much less surface area is required by the technique described herein. Also, it is much easier to form field oxide with two or more different thicknesses across different regions of an integrated circuit.

Formation of the First Polysilicon Layer

A usual way of forming a doped polycrystalline silicon layer to act as an electrical conductor within an integrated circuit is to deposit amorphous silicon with heavy in situ doping of one of the usual arsenic, phosphorus or boron ions. This is desired because the temperature at which the process is carried out is necessarily maintained below about 580° Celsius. This layer later becomes polycrystalline in the course of the structure being raised to much higher temperatures as other processing steps are accomplished. An alternate technique is to deposit in situ doped polycrystalline silicon at a temperature above about 620° Celsius. A method of doing this is described in aforementioned copending U.S. patent application Ser. No. 07/629,250, now U.S. Pat. No. 5,343,063 having a counterpart European patent application publication no. 491,581. This is the preferred method for forming at least the second and third polysilicon layers in each of the memory cell embodiments described above.

However, there are advantages to using a different technique to form the first polysilicon layer that becomes the floating gates of the memory cells, in order to better control the level of dopant at a much lower level than usual. The level of dopant within in situ deposited polysilicon material can vary widely among different wafers of a batch of wafers being simultaneously processed. In some applications, this variation is not too much of a problem since the doping levels can simply be made high enough so that even the most lightly doped wafer of a batch of wafers is sufficiently high. However, where it is desired that the doping level be maintained within a narrow range, these techniques can only be implemented with very small batches of only a few wafers each. This, of course, severely limits the rate in which wafers can be formed and affects their manufacturing cost.

In the present memory structure, it is preferred that the memory cell floating gates formed from the first polysilicon layer have a very low, accurately controlled dopant concentration. The amount of doping that is desired is about one tenth that of a usual polysilicon layer from which ordinary conductors are formed. Although the memory cell floating gates need to be somewhat conductive in order to function, they do not need to be as conductive as desired when polysilicon is used to conduct electrons from one point of the circuit to another. By maintaining the doping level of the floating gates low, the tunnel oxide that is grown on the floating gate, to serve as a dielectric between it and the erase gate, will contain less of the dopant. This, and the characteristic that the lower doped oxide conforms better to the underlying floating gate surface, allows the tunnel oxide layers to be made much thinner than usual, resulting in lower voltages being required to erase the cells. Also, the reduced level of dopant in the tunnel oxide layer greatly increases the number of cycles to which the memory array may be subjected during its lifetime since the number of electron traps in the tunnel oxide is significantly reduced. The breakdown characteristics of the oxide layer are greatly improved.

The lower doping level desired for the floating gates is less than $1\times10^{20}$ atoms per cubic centimeter, about one-tenth of a usual concentration for a conductor made from doped polysilicon. A concentration within the polysilicon of less than about 0.8 weight percent of arsenic or phosphorous is used. The second and third polysilicon layers of the foregoing embodiments are doped to the usual higher level. As a minimum, in order for the floating gates to have a high enough conductivity to perform their function, the doping concentration is made to be in excess of $1\times10^{18}$ atoms/cc. This concentration range results in the first polysilicon layer, and thus the floating gates formed from it, to have a sheet resistance generally within a range of greater than 200 ohms per square, about ten times that of a normal polysilicon conductor, and less than 100,000 ohms per square.

Although the in situ techniques can provide this in small batches, the first polysilicon layer can alternatively be formed with such a carefully controlled, low level of dopant by an alternative process that is illustrated in FIG. 27. The process includes depositing undoped polysilicon and then separately implanting doping ions into it at a precisely controlled level. A first step 261 results in a layer of undoped polycrystalline silicon being deposited at a temperature above 620 degrees Celsius, typically at about 640 degrees, over the entire wafer. A next step 263 is to implant desired dopant ions into that layer without obstruction. One of the usual arsenic, phosphorus or boron dopant ions is selected. A density of the ions is kept very low, and other parameters controlled, in order to end up with the concentration of dopant described above. The implantation of the ions, after the undoped polysilicon layer has been deposited, allows relatively precise control of the doping level.

As described earlier, this first polysilicon layer is separated into individual floating gates as part of many subsequent processing steps, as indicated by a step 265 of FIG. 27. As some point in the process as previously described, and as indicated in a step 267, tunnel oxide is grown on an exposed surface of each of the floating gates. It is this erase gate dielectric that can be made thinner than usual, because of the reduced amount of dopant ions that are diffused into the dielectric from the doped polysilicon material. The thickness is typically controlled to be within a range of from about 100 to 450 Angstroms, as desired. Examples of the resulting tunnel oxide layers are shown as elements 125 and 129 of FIG. 13C.'

With reference to FIGS. 28 and 29, a technique is shown for physically forming the first polysilicon layer. These cross-sectional views show how this can be accomplished, at a stage of the process that is intermediate of the stages shown in FIGS. 7C and 8C, the same reference numbers being used for the same elements. Rather than directly depositing the first polysilicon layer to the desired end thickness, as shown in FIG. 28, it is deposited to a thickness significantly greater than that and then a top portion is removed in order to leave a smooth surface upon which additional elements of the structure are formed, as shown in FIG. 29.

FIG. 28 shows the unevenness of the top surface of a polysilicon layer 291 that is deposited only to a thickness T that is desired for the completed circuit. When that thickness is small relative to the spacing between the field oxide strips (65 and 67, for example), the top surface of the polysilicon will be very uneven, as shown in FIG. 28. The significant unevenness of the surface upon which the polysilicon is deposited is the cause of this. Difficulties are then presented in the formation of other layers on top of the polysilicon layer. One way to obtain a smooth top surface is to make the polysilicon layer much thicker, as can be seen from the surface 293 of a thicker layer deposited in the embodiment of FIG. 29. However, this is usually undesirable since subsequent processing then requires etching a much thicker layer than would otherwise be necessary.

Therefore, as shown in FIG. 29, this layer of polysilicon is deposited to a thickness much greater than the thickness T that is ultimately desired but then is followed by removal of a portion of it. The layer is initially deposited to a thickness wherein the top surface 293 is substantially smooth. A uniform amount of the top portion 295 of the polysilicon is then removed in order to leave a layer with a minimum thickness T and a smooth top surface 297. A preferred technique for removing the top portion 295 is to oxidize it and then strip it off, leaving the portion shown cross-hatched in FIG. 29.

Although the various aspects of the present invention have been described with respect to their preferred embodiments, it will be understood that the invention is entitled to protection within the full scope of the appended claims.

It is claimed:

1. A method of forming circuit elements in at least two non-overlapping regions of an integrated circuit on a substrate, comprising the steps of:

forming a first layer of silicon dioxide with a first common thickness in both of said first and second regions, masking said first region against being etched, etching away the first layer of silicon dioxide in the second region, removing the mask over the first region, forming a second layer of silicon dioxide with a second common thickness in both of said first and second regions, whereby silicon dioxide results in the first region with the first thickness and in the second region with both the first and second thickness, anisotropically etching away portions of the silicon dioxide in both of the first and second regions according to a pattern thereacross, thereby to form openings therein according to said pattern, and forming circuit elements in said openings within both of the first and second regions.

2. The method according to claim 1, wherein the circuit forming step includes forming an array of memory cells in the first region and peripheral circuits in the second region.

3. The method according to claim 1 wherein the circuit forming step includes simultaneously forming at least some components of the circuit elements in both of the first and second regions.

4. A method of forming field effect transistors in a region of an integrated circuit surrounding a memory cell array, comprising the steps of:

depositing a field oxide layer on a semiconductor substrate surface by a CVD process, anisotropically etching away portions of the field oxide layer according to a pattern thereacross, thereby to form openings in said layer with sidewalls that are substantially perpendicular to the substrate surface, depositing a dielectric layer over the etched field oxide layer, anisotropically etching away said deposited dielectric layer from the field oxide layer in a manner to leave spacers along the sidewalls of the openings in the field oxide layer, and forming transistors in said openings between the spacers.

* * * * *